United States Patent
Nakamura et al.

(10) Patent No.: US 9,991,280 B2
(45) Date of Patent: *Jun. 5, 2018

(54) MULTI-TIER THREE-DIMENSIONAL MEMORY DEVICES CONTAINING ANNULAR DIELECTRIC SPACERS WITHIN MEMORY OPENINGS AND METHODS OF MAKING THE SAME

(71) Applicant: SANDISK TECHNOLOGIES LLC, Plano, TX (US)

(72) Inventors: Tadashi Nakamura, Yokkaichi (JP); Jin Liu, Milpitas, CA (US); Kazuya Tokunaga, Yokkaichi (JP); Marika Gunji-Yoneoka, Sunnyvale, CA (US); Matthias Baenninger, Palo Alto, CA (US); Hiroyuki Kinoshita, Yokkaichi (JP); Murshed Chowdhury, Milpitas, CA (US); Jiyin Xu, Yokkaichi (JP); Dai Iwata, Yokkaichi (JP); Hiroyuki Ogawa, Yokkaichi (JP); Kazutaka Yoshizawa, Yokkaichi (JP); Yasuaki Yonemochi, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/434,544

(22) Filed: Feb. 16, 2017

(65) Prior Publication Data

US 2017/0236835 A1    Aug. 17, 2017

Related U.S. Application Data

(60) Provisional application No. 62/296,268, filed on Feb. 17, 2016.

(51) Int. Cl.
*H01L 27/115*     (2017.01)
*H01L 27/11582*   (2017.01)
(Continued)

(52) U.S. Cl.
CPC ... *H01L 27/11582* (2013.01); *H01L 21/31111* (2013.01); *H01L 21/764* (2013.01);
(Continued)

(58) Field of Classification Search
CPC ......... H01L 27/11582; H01L 21/28273; H01L 27/11565; H01L 27/11521;
(Continued)

(56) References Cited

U.S. PATENT DOCUMENTS 5,915,167 A    6/1999  Leedy
8,884,357 B2  11/2014  Wang et al.
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Bitew Dinke
(74) *Attorney, Agent, or Firm* — The Marbury Law Group PLLC

(57) ABSTRACT

An annular dielectric spacer can be formed at a level of a joint-level dielectric material layer between vertically neighboring pairs of alternating stacks of insulating layers and spacer material layers. After formation of a memory opening through multiple alternating stacks and formation of a memory film therein, an anisotropic etch can be performed to remove a horizontal bottom portion of the memory film. The annular dielectric spacer can protect underlying portions of the memory film during the anisotropic etch. In addition, (Continued)

a silicon nitride barrier may be employed to suppress hydrogen diffusion at an edge region of peripheral devices.

15 Claims, 36 Drawing Sheets

(51) Int. Cl.
| | |
|---|---|
| H01L 29/06 | (2006.01) |
| H01L 29/10 | (2006.01) |
| H01L 23/528 | (2006.01) |
| H01L 29/423 | (2006.01) |
| H01L 21/311 | (2006.01) |
| H01L 21/764 | (2006.01) |
| H01L 23/29 | (2006.01) |
| H01L 23/31 | (2006.01) |
| H01L 49/02 | (2006.01) |

(52) U.S. Cl.
CPC ........ *H01L 23/291* (2013.01); *H01L 23/3171* (2013.01); *H01L 23/528* (2013.01); *H01L 28/00* (2013.01); *H01L 29/0649* (2013.01); *H01L 29/1037* (2013.01); *H01L 29/42372* (2013.01)

(58) Field of Classification Search
CPC ........... H01L 21/28282; H01L 23/3171; H01L 23/291; H01L 21/764; H01L 21/31111; H01L 27/11573; H01L 29/42372; H01L 27/11526; H01L 23/528; H01L 29/1037; H01L 29/7883; H01L 27/11519; H01L 27/11556; H01L 27/11568; H01L 29/0649
See application file for complete search history.

(56) References Cited

U.S. PATENT DOCUMENTS

| | | | |
|---|---|---|---|
| 8,946,023 B2 | 2/2015 | Makala et al. | |
| 9,230,987 B2 | 1/2016 | Pachamuthu et al. | |
| 9,502,471 B1 | 11/2016 | Lu et al. | |
| 9,570,463 B1* | 2/2017 | Zhang | H01L 29/66666 |
| 9,768,192 B1* | 9/2017 | Nakamura | H01L 27/11582 |
| 2009/0224309 A1* | 9/2009 | Kidoh | H01L 21/8221 |
| | | | 257/326 |
| 2011/0287612 A1* | 11/2011 | Lee | H01L 27/11565 |
| | | | 438/478 |
| 2012/0001247 A1 | 1/2012 | Alsmeier | |
| 2014/0054676 A1* | 2/2014 | Nam | H01L 29/7926 |
| | | | 257/324 |
| 2014/0199815 A1* | 7/2014 | Hwang | H01L 29/66833 |
| | | | 438/270 |
| 2015/0179662 A1* | 6/2015 | Makala | H01L 27/11582 |
| | | | 257/314 |
| 2015/0294978 A1 | 10/2015 | Lu et al. | |
| 2016/0027796 A1* | 1/2016 | Yang | H01L 27/11573 |
| | | | 257/314 |
| 2016/0071881 A1* | 3/2016 | Lee | H01L 27/11582 |
| | | | 257/314 |
| 2016/0141294 A1* | 5/2016 | Peri | H01L 21/28512 |
| | | | 257/324 |
| 2016/0322381 A1* | 11/2016 | Liu | H01L 27/11573 |
| 2017/0148677 A1* | 5/2017 | Shin | H01L 21/76816 |
| 2017/0221921 A1* | 8/2017 | Kanamori | H01L 27/11575 |

OTHER PUBLICATIONS

Hammond, M. L., "Silicon Epitaxy by Chemical Vapor Deposition," pp. 45-106 in Seshan, K., *Handbook of Thin Film Deposition, 2rd Edition*, (2001). Available at http://booksite.elsevier.com/9781437778731/past_edition_chapters/Silicon_Epitaxy.pdf (visited Feb. 16, 2017).

Csepregi, L. et al., "Substrate-Orientation Dependence of the Epitaxial Regrowth Rate from Si-Implanted Amorphous Si," Journal of Applied Physics, vol. 49, No. 7, pp. 3906-3911 (1978).

Seidel, H. et al., "Anisotropic Etching of Crystalline Silicon in Alkaline Solutions," J. Electrochem. Soc., vol. 137, No. 11, pp. 3612-3626, (1990).

Non-Final Office Communication for U.S. Appl. No. 15/071,575, dated Nov. 16, 2016, 13 pages.

U.S. Appl. No. 14/834,830, filed Aug. 25, 2015, SanDisk Technologies LLC.

U.S. Appl. No. 14/883,966, filed Oct. 15, 2015, SanDisk Technologies LLC.

U.S. Appl. No. 15/015,190, filed Feb. 4, 2016, SanDisk Technologies LLC.

U.S. Appl. No. 15/049,444, filed Feb. 22, 2016, SanDisk Technologies LLC.

U.S. Appl. No. 15/071,575, filed Mar. 16, 2016, SanDisk Technologies LLC.

U.S. Appl. No. 15/183,195, filed Jun. 15, 2016, SanDisk Technologies LLC.

U.S. Appl. No. 15/186,768, filed Jun. 20, 2016, SanDisk Technologies LLC.

U.S. Appl. No. 15/243,260, filed Aug. 22, 2016, SanDisk Technologies LLC.

U.S. Appl. No. 15/335,850, filed Oct. 27, 2016, SanDisk Technologies LLC.

U.S. Appl. No. 15/347,101, filed Nov. 9, 2016, SanDisk Technologies LLC.

* cited by examiner

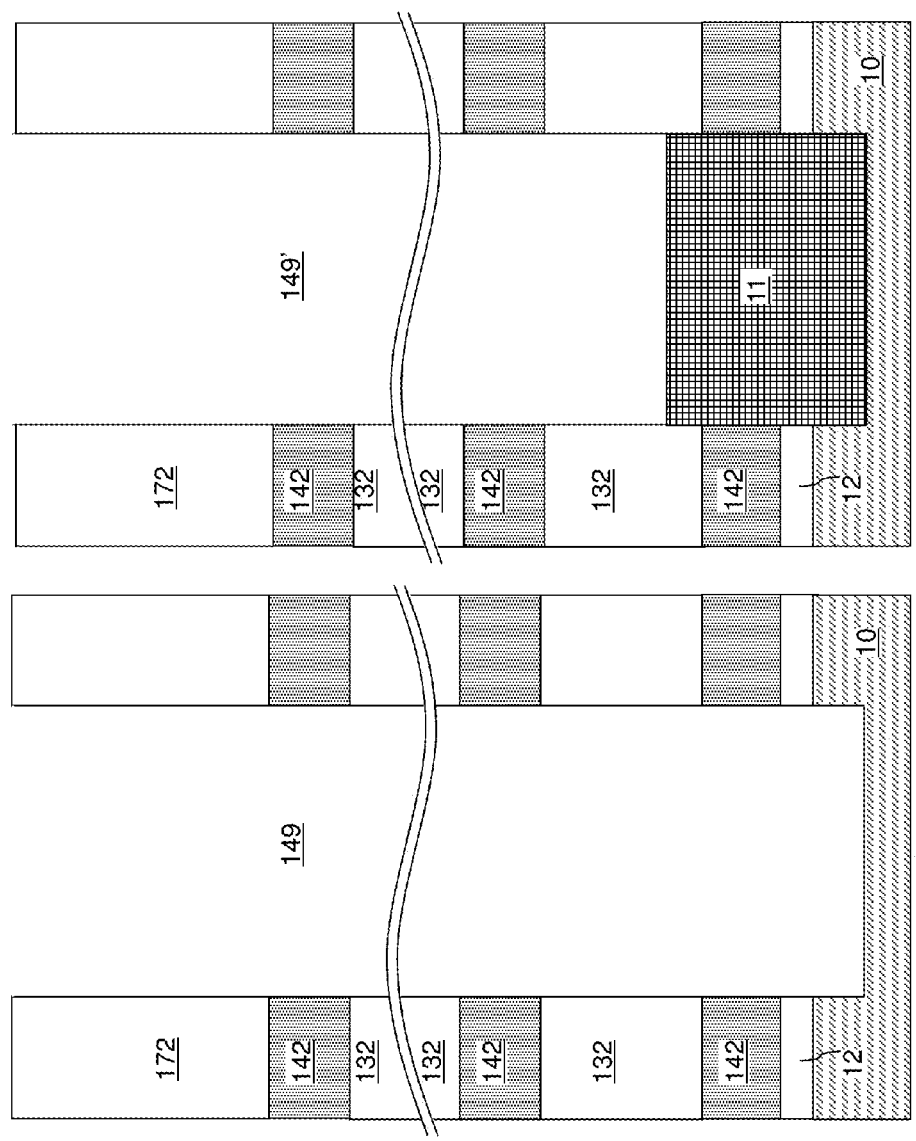

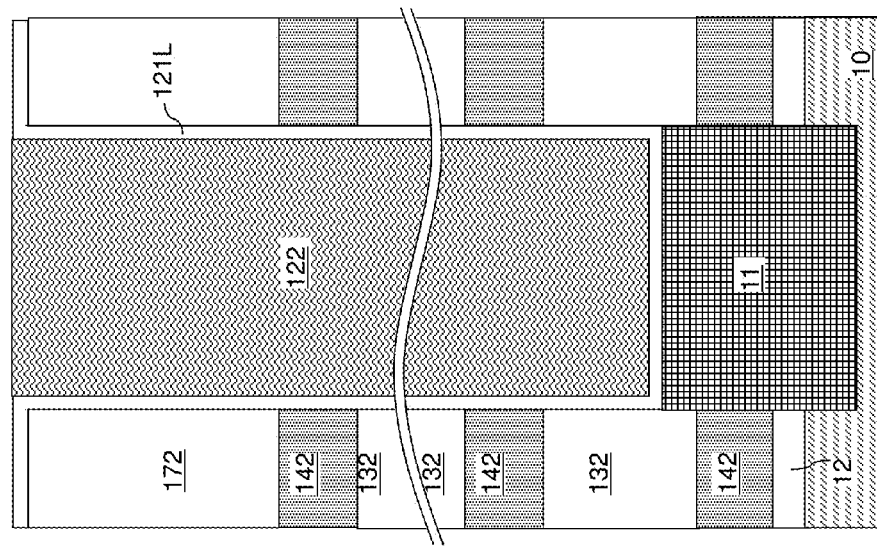
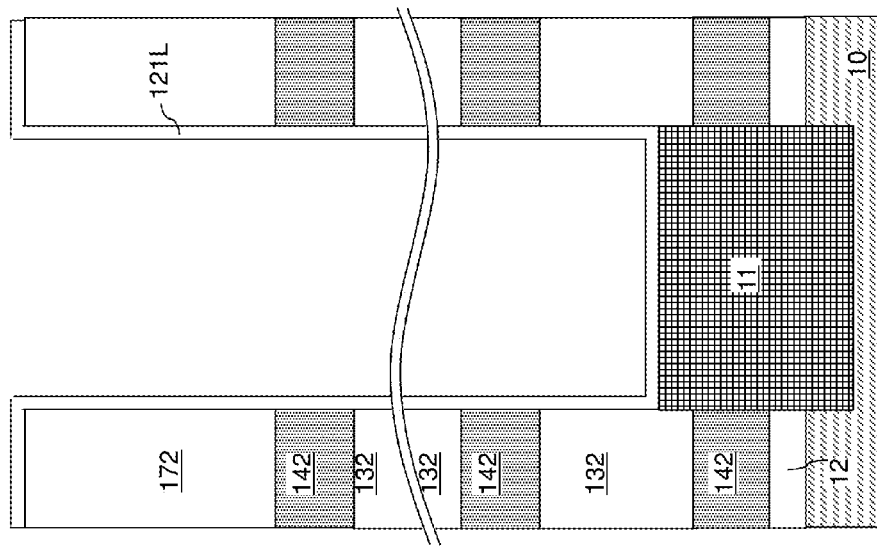

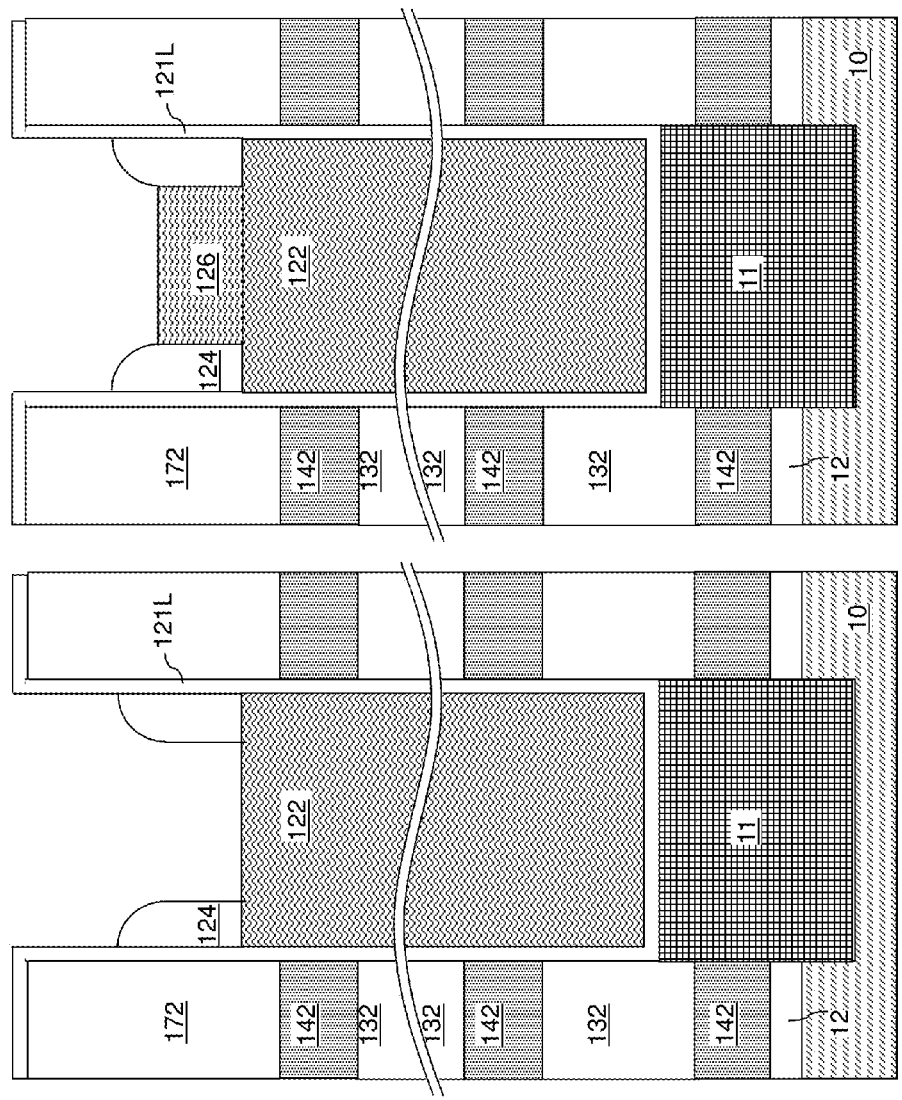

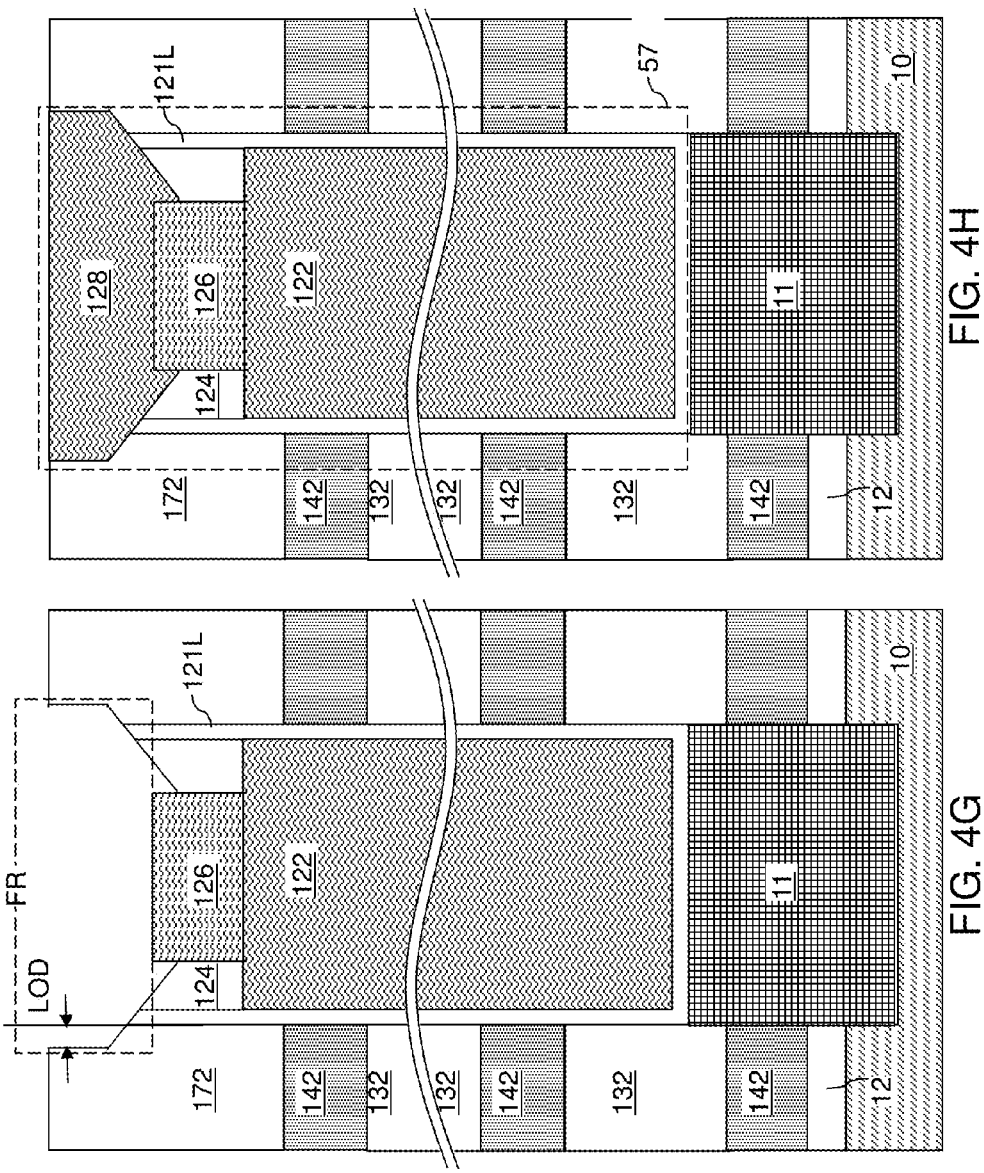

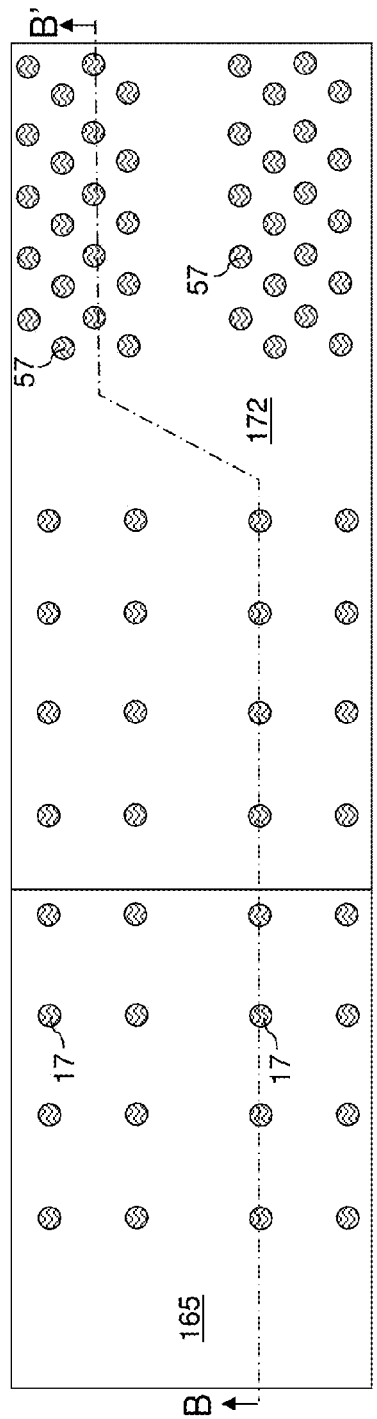
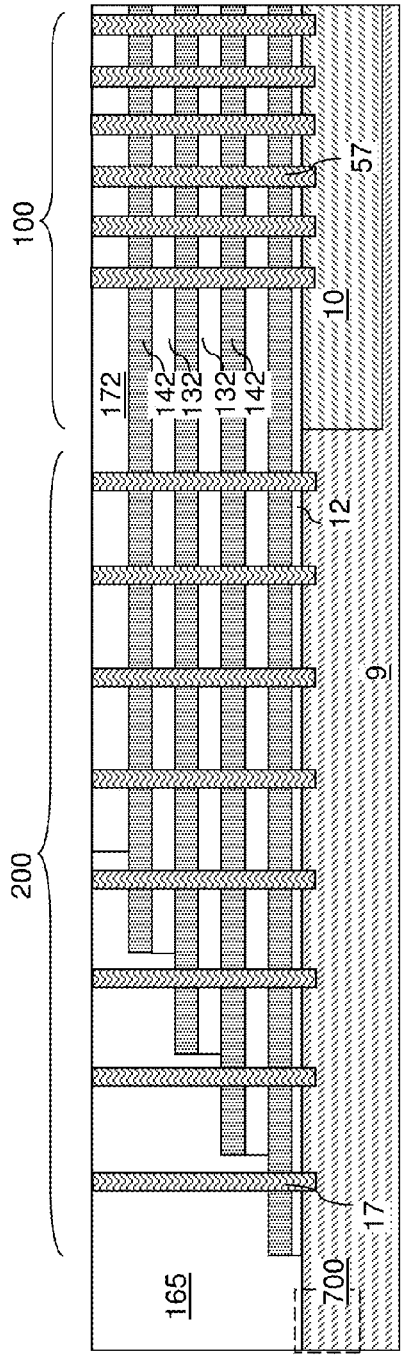
FIG. 5A
FIG. 5B

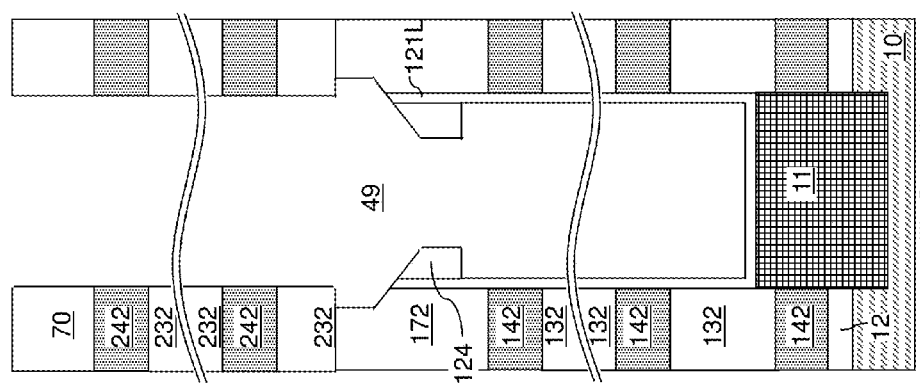
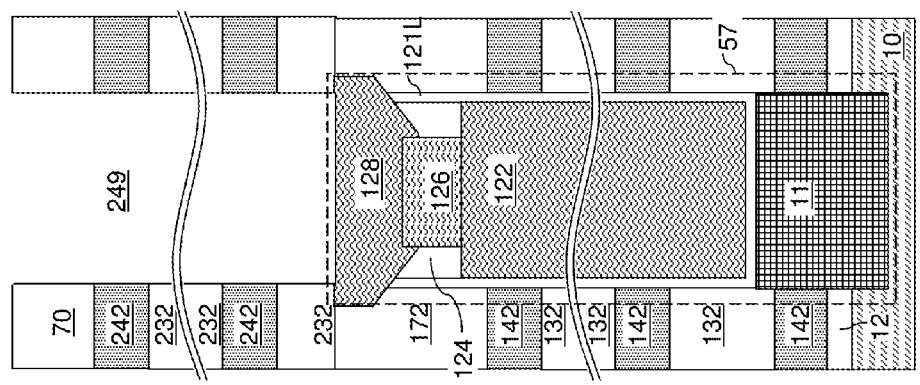

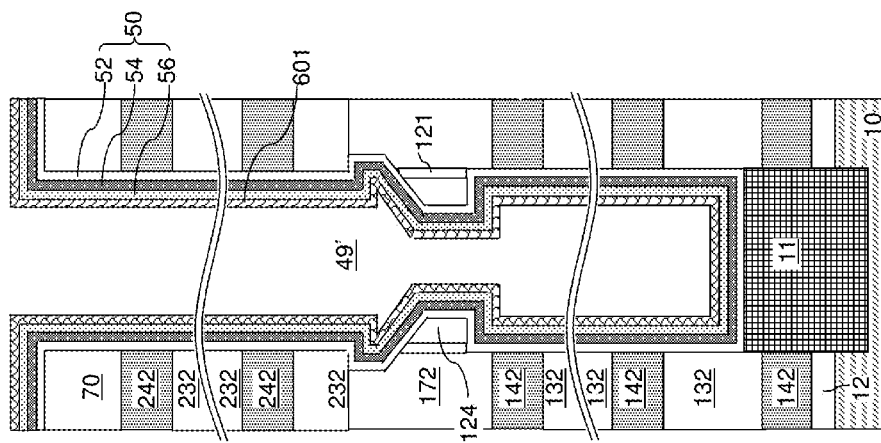
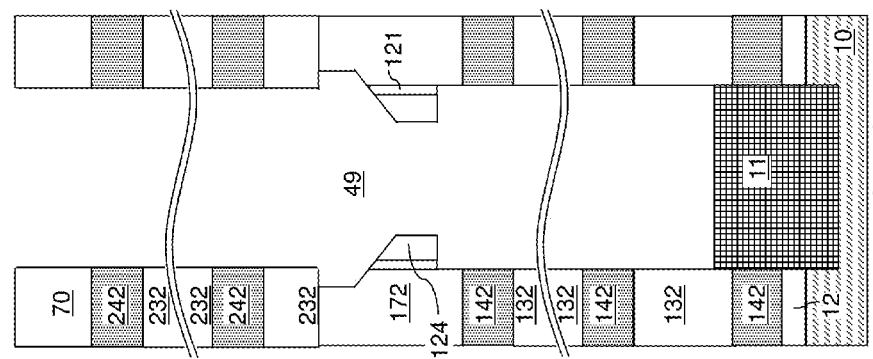
FIG. 9D
FIG. 9C

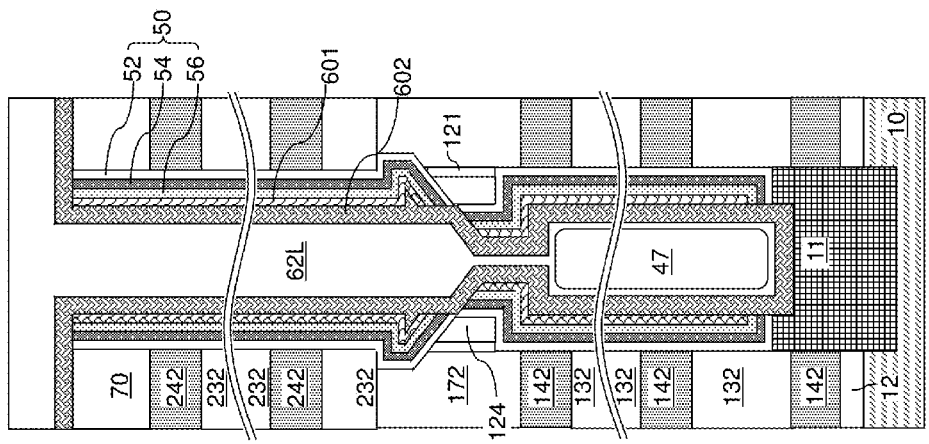
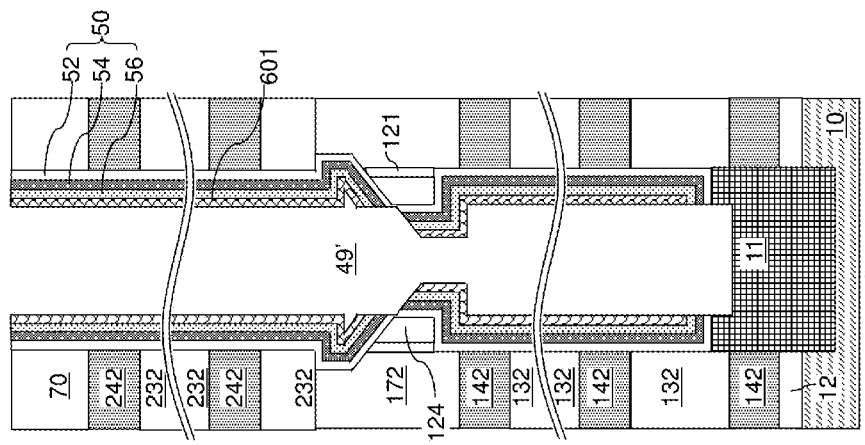

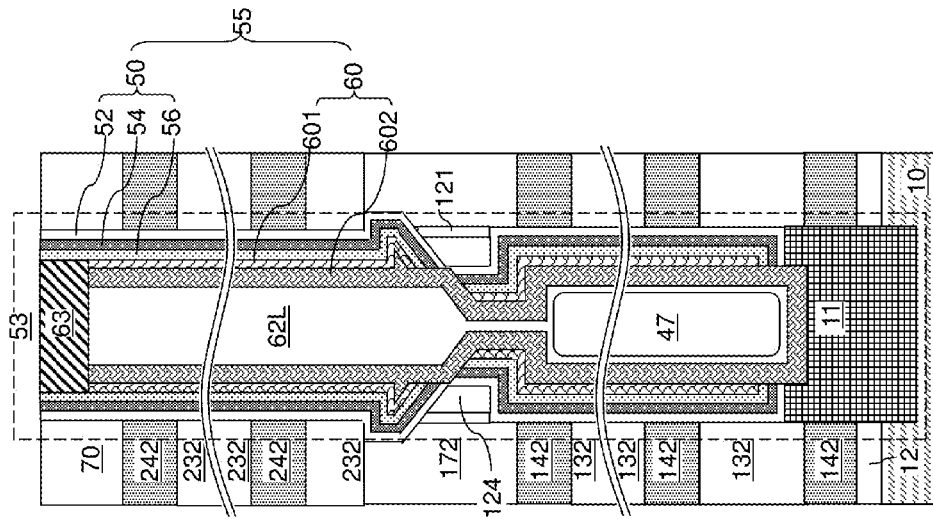
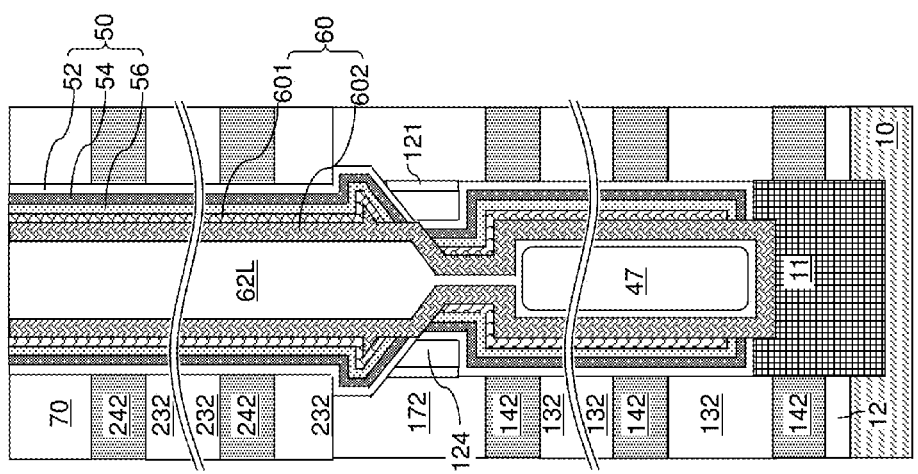

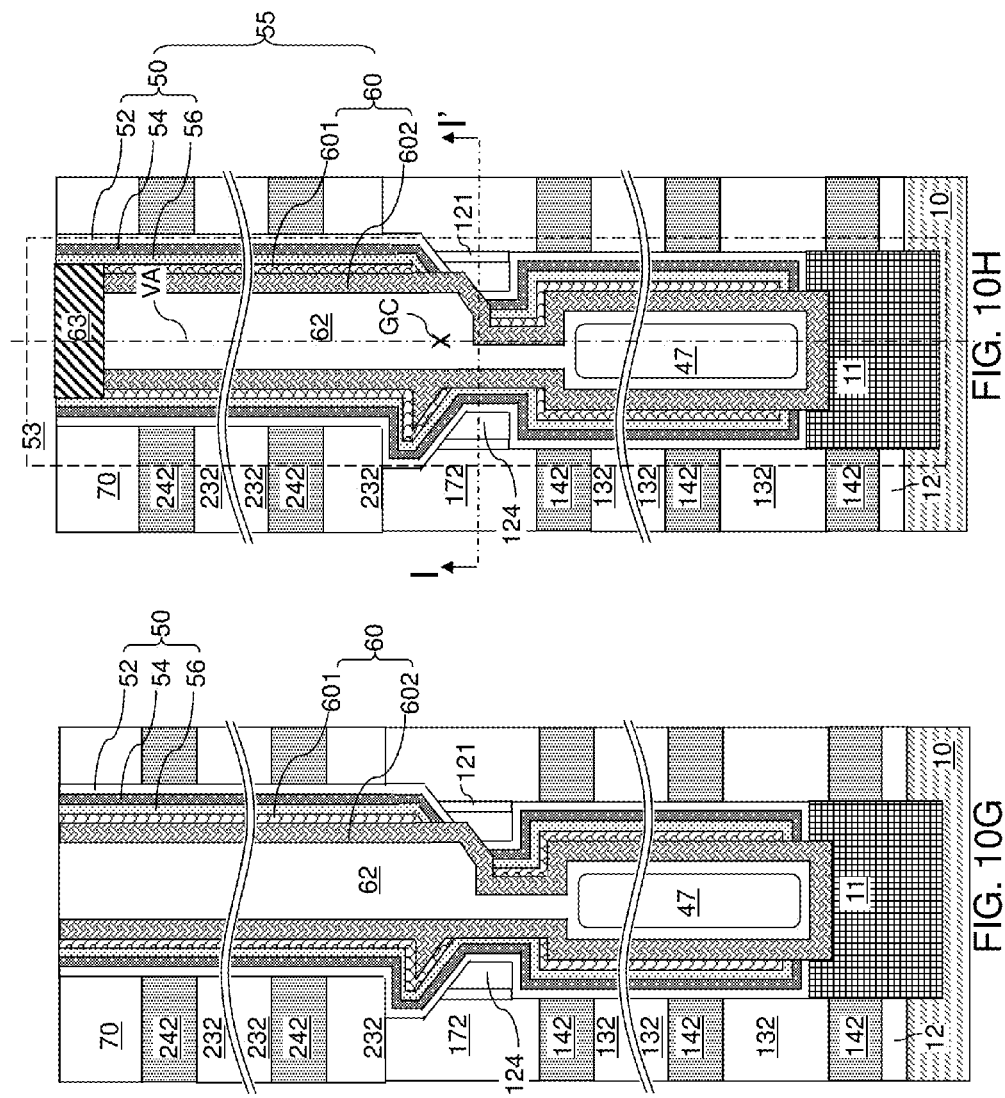

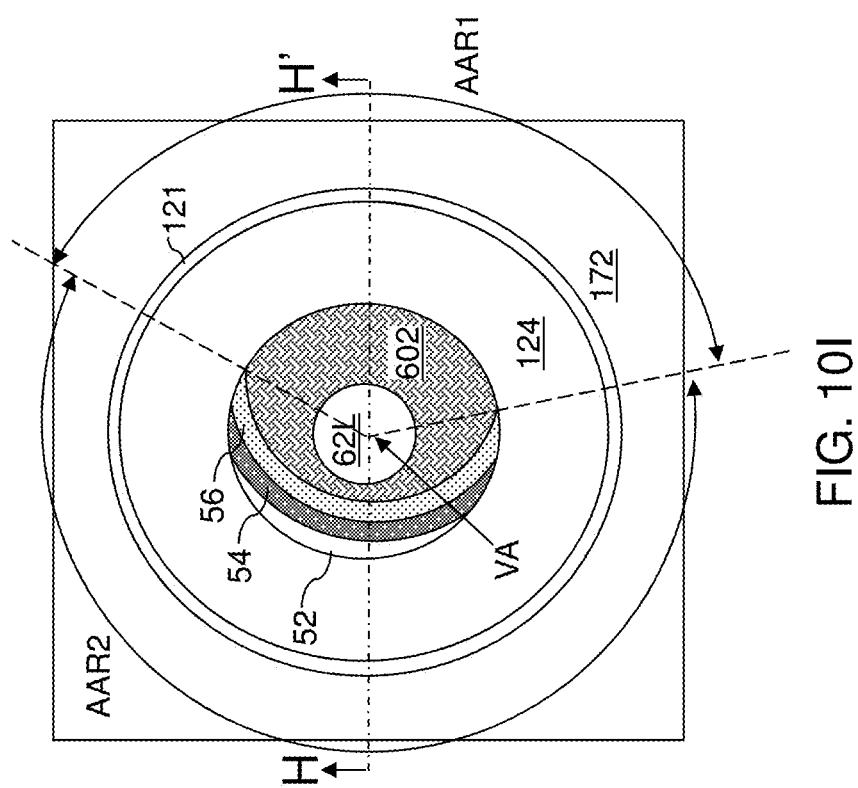

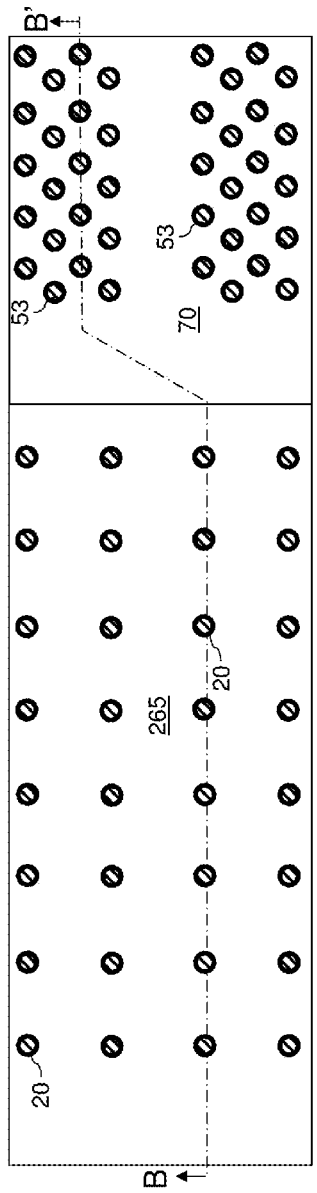
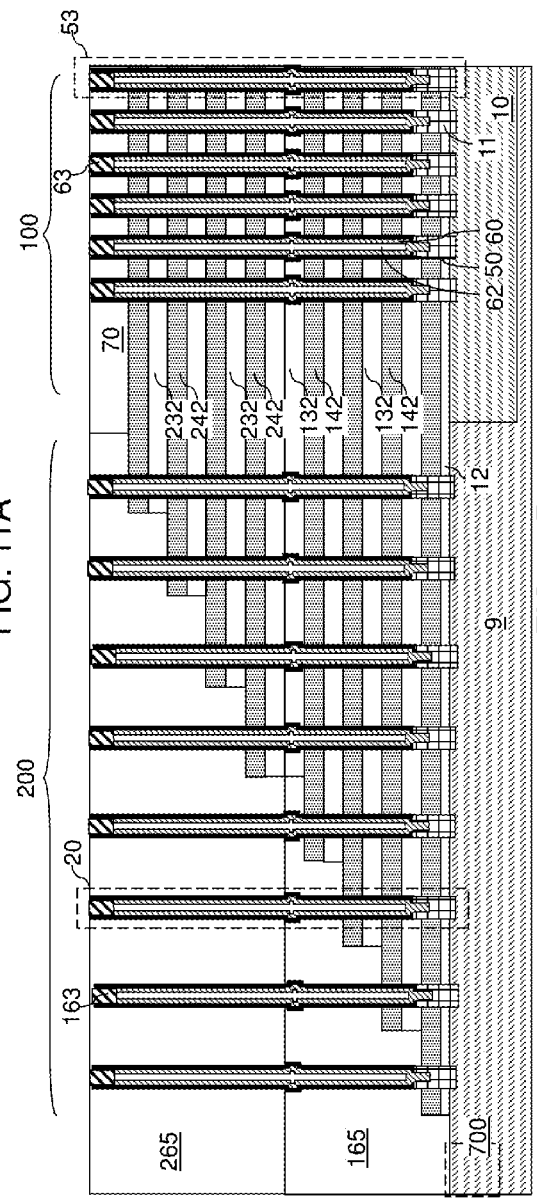
FIG. 11A
FIG. 11B

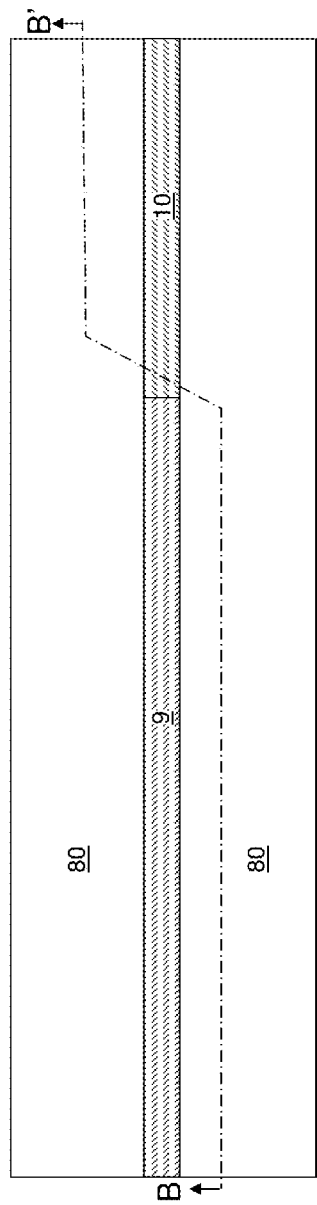
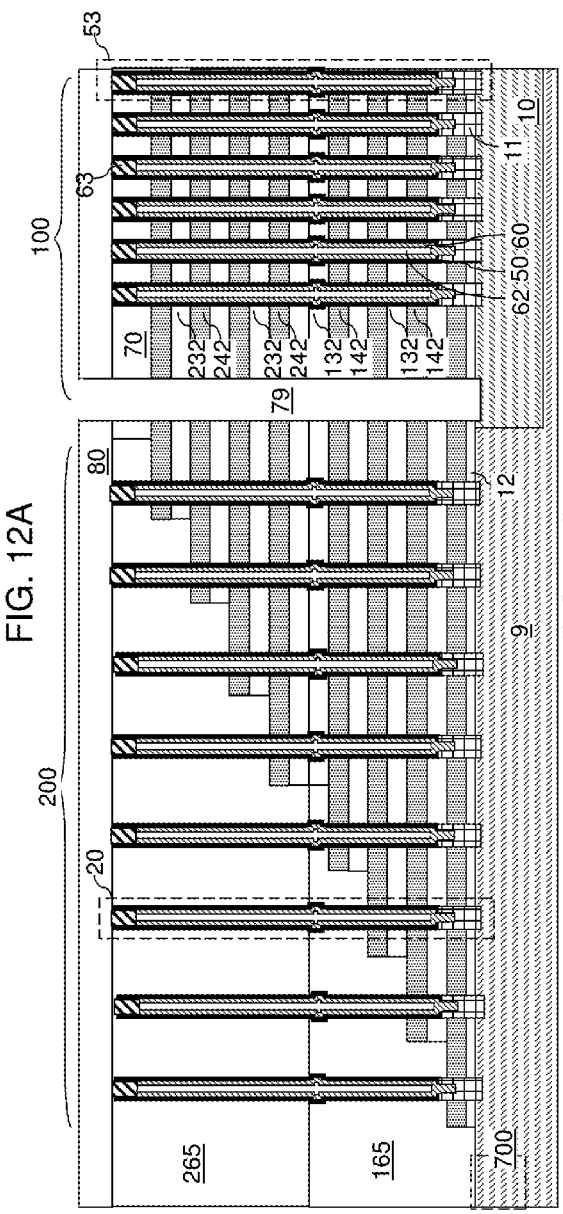

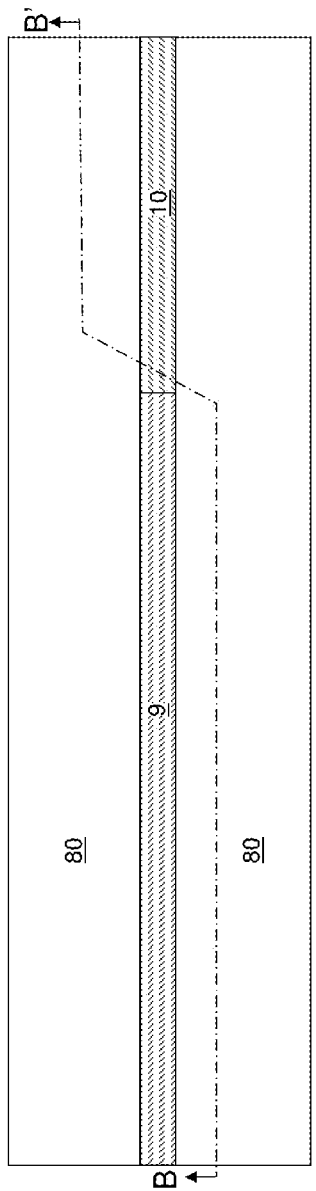
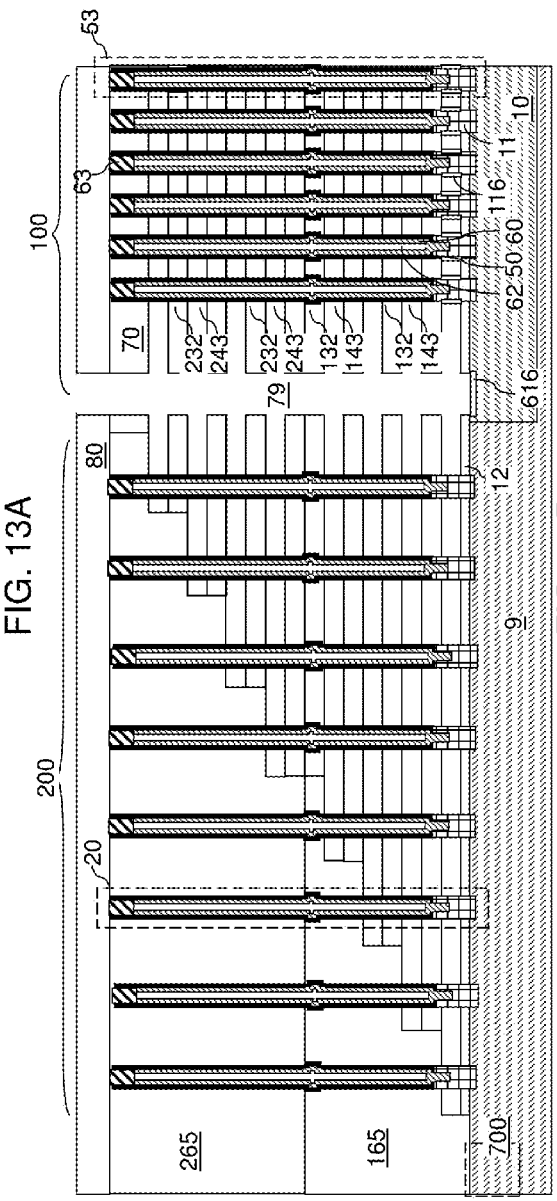
FIG. 13A
FIG. 13B

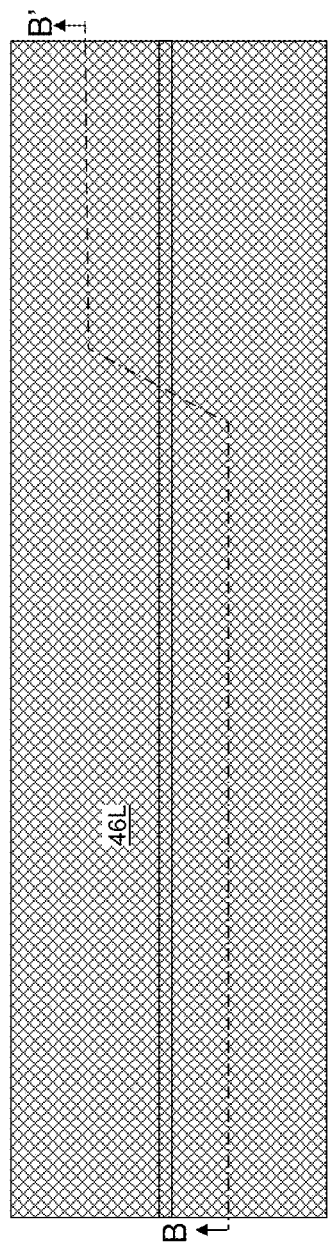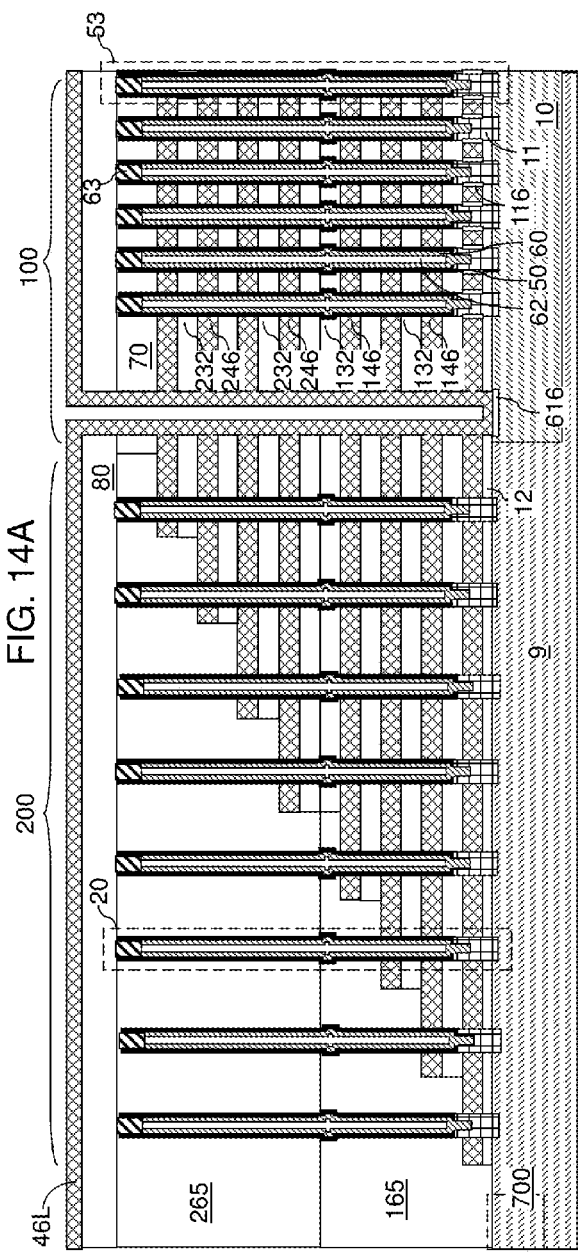
FIG. 14A
FIG. 14B

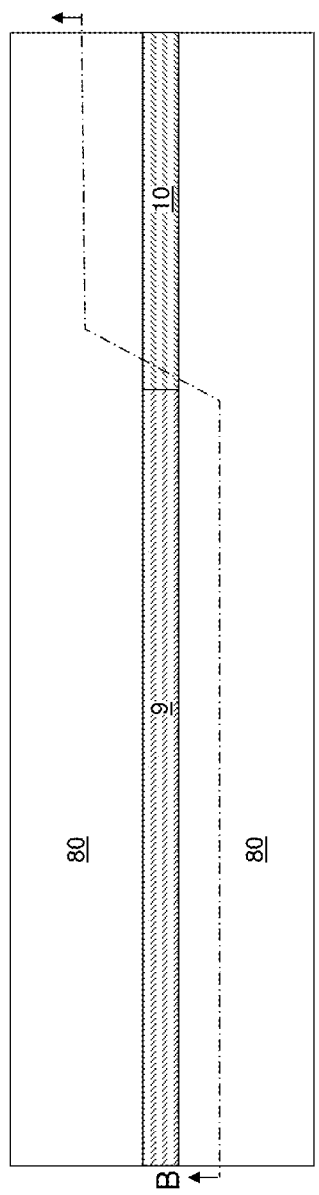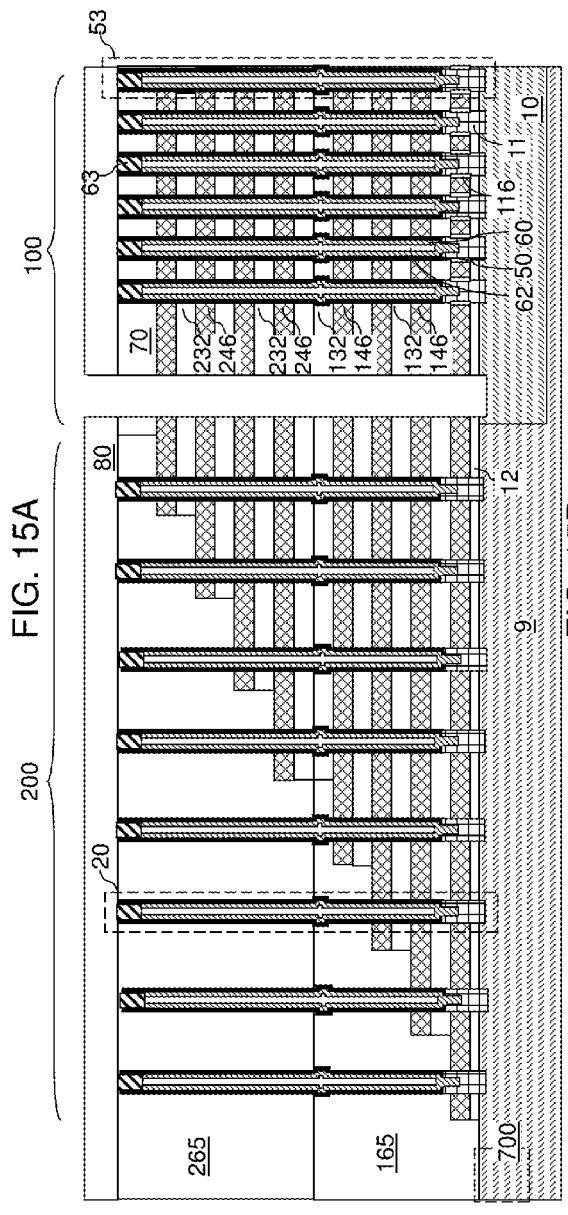
FIG. 15A
FIG. 15B

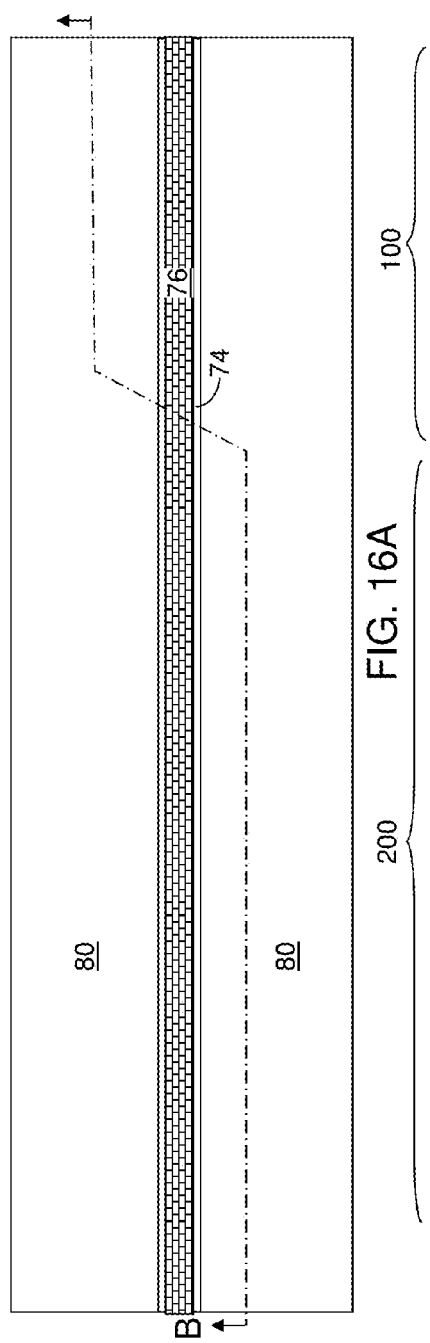
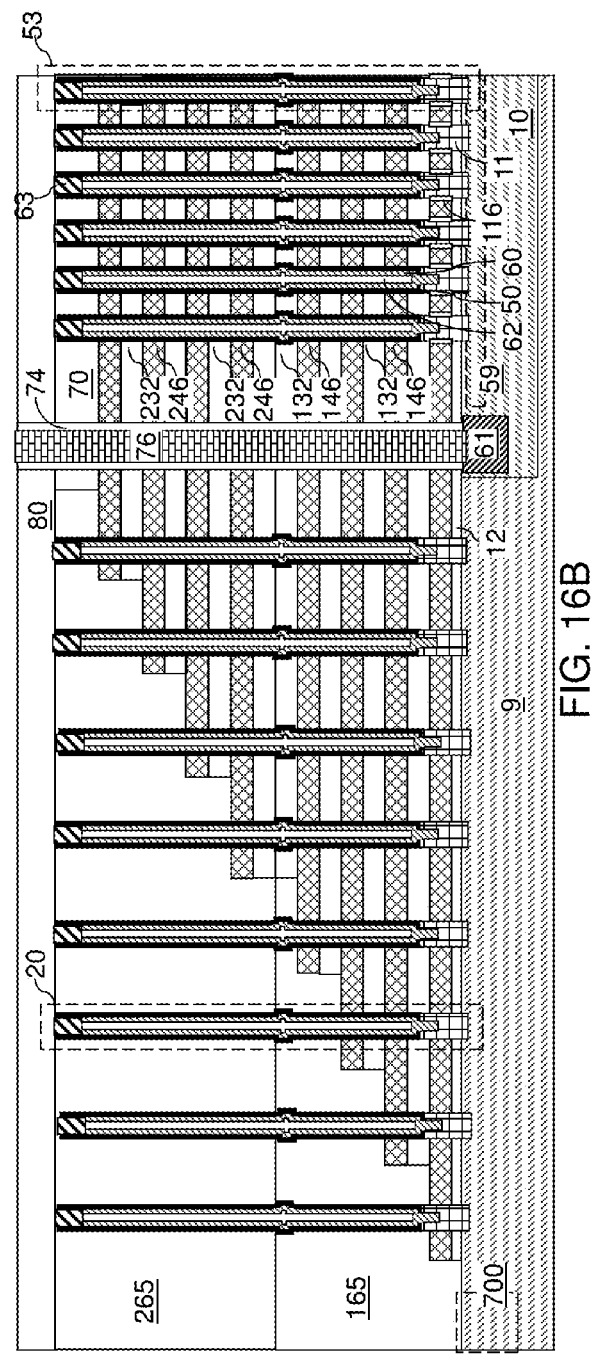
FIG. 16A
FIG. 16B

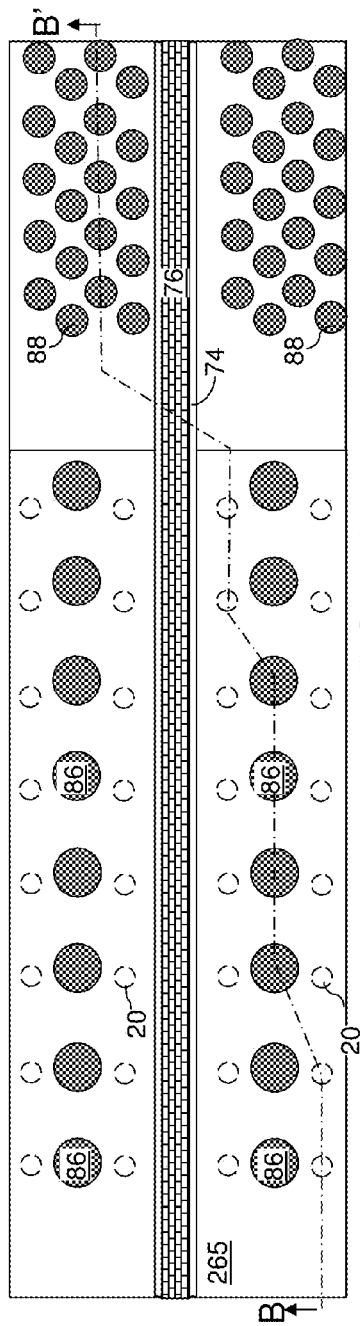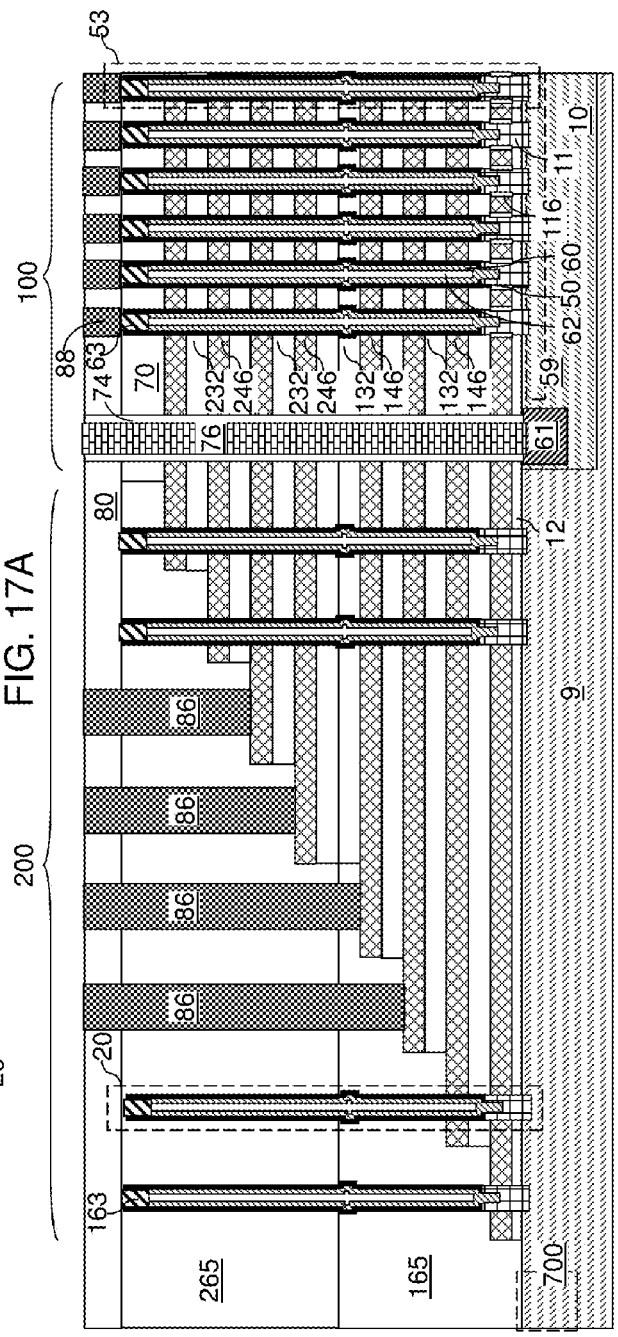
FIG. 17A
FIG. 17B

MULTI-TIER THREE-DIMENSIONAL MEMORY DEVICES CONTAINING ANNULAR DIELECTRIC SPACERS WITHIN MEMORY OPENINGS AND METHODS OF MAKING THE SAME

RELATED APPLICATIONS

The present application claims the benefit of priority from U.S. Provisional Application Ser. No. 62/296,268 filed on Feb. 17, 2016, the entire contents of which are incorporated herein by reference.

FIELD

The present disclosure relates generally to the field of three-dimensional memory devices and specifically to multi-tier three-dimensional memory devices containing annular dielectric spacers within memory openings and methods of making the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36. When multiple tier structures are employed in a three-dimensional memory device, a joint region between vertically neighboring tier structures is prone to an etch damage during an anisotropic etch of horizontal portions of a memory film. Such an etch damage can induce an electrical short between vertical semiconductor channels and electrically conductive layers that function as word lines. A method of preventing such electrical shorts is thus desired.

SUMMARY

According to an aspect of the present disclosure, a three-dimensional memory device is provided, which comprises: a first alternating stack of first insulating layers and first electrically conductive layers and located over a substrate; a joint-level dielectric material layer overlying the first alternating stack; a second alternating stack of second insulating layers and second electrically conductive layers and overlying the joint-level dielectric material layer; a memory stack structure comprising a memory film and a vertical semiconductor channel extending through the first alternating stack, the joint-level dielectric material layer, and the second alternating stack; and an annular dielectric spacer laterally surrounding the memory stack structure and surrounded by the joint-level dielectric material layer. At least a part of a bottom surface of the annular dielectric spacer is in physical contact with a surface of an outermost dielectric material layer of the memory film of the memory stack structure.

According to another aspect of the present disclosure, a method of forming a three-dimensional memory device is provided. A first alternating stack comprising a first alternating stack of first insulating layers and first spacer material layers is formed over a substrate. A joint-level dielectric material layer is formed over the first alternating stack. A first-tier memory opening is formed through the joint-level dielectric material layer and the first alternating stack. An annular dielectric spacer is formed within the first-tier memory opening at a level of the joint-level dielectric material layer. A second alternating stack of second insulating layers and second electrically conductive layers is formed over the joint-level dielectric material layer. A second-tier memory opening is formed through the second alternating stack and over the first-tier memory opening. A memory opening is formed, which includes an entire volume of the second-tier memory opening and a predominant portion of a volume of the first-tier memory opening that excludes a volume of the annular dielectric spacer. A memory film and a cover material layer are formed in the memory opening. Horizontal portions of the cover material layer and the memory film are anisotropically etched such that a semiconductor surface is physically exposed at a bottom of a cavity within the memory opening. A vertical semiconductor channel is formed inside the memory film by depositing a semiconductor material in the memory opening. The first and second spacer material layers are formed as, or are subsequently replaced with, first and second electrically conductive layers, respectively.

According to an aspect of the present disclosure, a three-dimensional memory comprises a device region containing an array of vertical NAND strings, a peripheral device region, and a silicon nitride barrier which separates the peripheral device region from the array of vertical NAND strings which is configured to block a pathway of hydrogen gas to the peripheral device region.

BRIEF DESCRIPTION OF THE DRAWINGS

FIG. 4A is vertical cross-sectional view of a region around a first-tier memory opening after formation of the first-tier memory opening according to an embodiment of the present disclosure.

FIG. 4B is vertical cross-sectional view of the region around the first-tier memory opening after formation of an epitaxial channel portion according to an embodiment of the present disclosure.

FIG. 4C is vertical cross-sectional view of the region around the first-tier memory opening after formation of a dielectric liner layer according to an embodiment of the present disclosure.

FIG. 4D is vertical cross-sectional view of the region around the first-tier memory opening after formation of a first sacrificial fill material portion according to an embodiment of the present disclosure.

FIG. 4E is vertical cross-sectional view of the region around the first-tier memory opening after recessing the first sacrificial fill material portion and formation of an annular dielectric spacer according to an embodiment of the present disclosure.

FIG. 4F is vertical cross-sectional view of the region around the first-tier memory opening after formation of a second sacrificial fill material portion according to an embodiment of the present disclosure.

FIG. 4G is vertical cross-sectional view of the region around the first-tier memory opening after formation of a flare region by isotropically etching surfaces of a joint-level dielectric material layer according to an embodiment of the present disclosure.

FIG. 4H is vertical cross-sectional view of the region around the first-tier memory opening after formation of a third sacrificial fill material portion according to an embodiment of the present disclosure.

FIG. 5A is a top-down view of the exemplary structure after formation of a sacrificial memory opening fill structure in each memory opening and a sacrificial support opening fill structure in each support opening according to an embodiment of the present disclosure.

FIG. 5B is a vertical cross-sectional view of the exemplary structure of FIG. 5A along the vertical plane B-B'.

FIG. 9A is a vertical cross-sectional view of a region including a vertically neighboring pair of a first-tier memory opening and a second-tier memory opening of the exemplary structure after formation of second-tier memory openings for the case of perfect alignment according to an embodiment of the present disclosure.

FIG. 9B is a vertical cross-sectional view of the region of the exemplary structure after formation of a through-tier memory opening by removal of sacrificial fill material portions for the case of perfect alignment according to an embodiment of the present disclosure.

FIG. 9C is a vertical cross-sectional view of the region of the exemplary structure after etching physically exposed portions of the dielectric liner layer for the case of perfect alignment according to an embodiment of the present disclosure.

FIG. 9D is a vertical cross-sectional view of the region of the exemplary structure after formation of a memory film for the case of perfect alignment according to an embodiment of the present disclosure.

FIG. 9E is a vertical cross-sectional view of the region of the exemplary structure after an anisotropic etch that anisotropically etches the memory film for the case of perfect alignment according to an embodiment of the present disclosure.

FIG. 9F is a vertical cross-sectional view of the region of the exemplary structure after formation of a vertical semiconductor channel and a dielectric core layer for the case of perfect alignment according to an embodiment of the present disclosure.

FIG. 9G is a vertical cross-sectional view of the region of the exemplary structure after vertically recessing the dielectric core layer for the case of perfect alignment according to an embodiment of the present disclosure.

FIG. 9H is a vertical cross-sectional view of the region of the exemplary structure after formation of a drain region for the case of perfect alignment according to an embodiment of the present disclosure.

FIG. 10G is a vertical cross-sectional view of the region of the exemplary structure after vertically recessing the dielectric core layer for the case of maximum misalignment according to an embodiment of the present disclosure.

FIG. 10H is a vertical cross-sectional view of the region of the exemplary structure after formation of a drain region for the case of maximum misalignment according to an embodiment of the present disclosure.

FIG. 10I is a horizontal cross-sectional view of the structure of FIG. 10F along the horizontal plane I-I' of FIG. 10H. The vertical plane H-H' represents the plane of the vertical cross-sectional view of FIG. 10H.

FIG. 11A is a top-down view of the exemplary structure after formation of memory stack structures and support pillar structures according to an embodiment of the present disclosure.

FIG. 11B is a vertical cross-sectional view of the exemplary structure of FIG. 11A along the vertical plane B-B'.

FIG. 12A is a top-down view of the exemplary structure after formation of a contact level dielectric layer and a backside contact trench according to an embodiment of the present disclosure.

FIG. 12B is a vertical cross-sectional view of the exemplary structure of FIG. 12A along the vertical plane B-B'.

FIG. 13A is a top-down view of the exemplary structure after formation of backside recesses according to an embodiment of the present disclosure.

FIG. 13B is a vertical cross-sectional view of the exemplary structure of FIG. 13A along the vertical plane B-B'.

FIG. 14A is a top-down view of the exemplary structure after formation of first and second electrically conductive layers and a continuous conductive material layer according to an embodiment of the present disclosure.

FIG. 14B is a vertical cross-sectional view of the exemplary structure of FIG. 14A along the vertical plane B-B'.

FIG. 15A is a top-down view of the exemplary structure after removal of the continuous conductive material layer according to an embodiment of the present disclosure.

FIG. 15B is a vertical cross-sectional view of the exemplary structure of FIG. 15A along the vertical plane B-B'.

FIG. 16A is a top-down view of the exemplary structure after formation of an insulating spacer, a source region, and a backside contact via structure according to an embodiment of the present disclosure.

FIG. 16B is a vertical cross-sectional view of the exemplary structure of FIG. 16A along the vertical plane B-B'.

FIG. 17A is a top-down view of the exemplary structure after formation of additional contact via structures according to an embodiment of the present disclosure.

FIG. 17B is a vertical cross-sectional view of the exemplary structure of FIG. 17A along the vertical plane B-B'.

DETAILED DESCRIPTION

Figure 1:
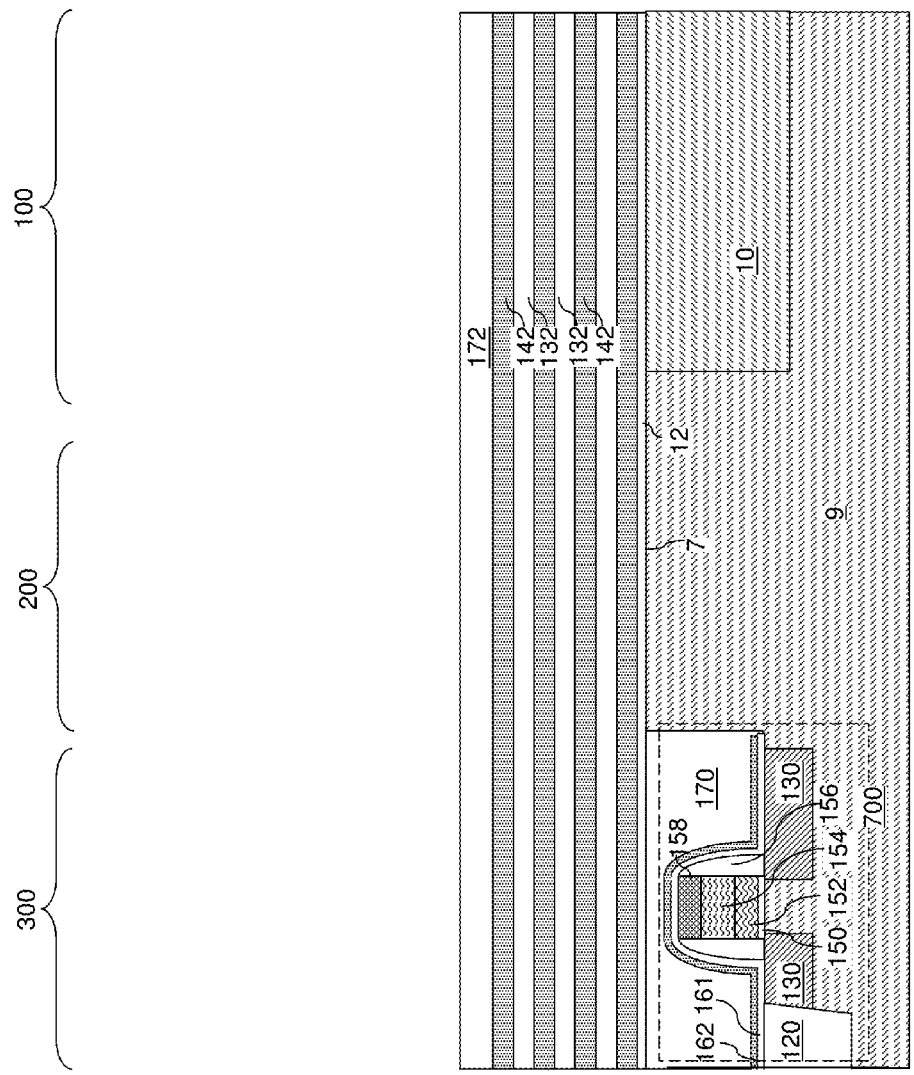
FIG. 1 is a vertical cross-sectional view of an exemplary structure after formation of at least one peripheral device and a first alternating stack of first insulating layers and first sacrificial material layers according to an embodiment of the present disclosure.

As discussed above, the present disclosure is directed multi-tier three-dimensional memory devices employing annular dielectric spacers within memory openings and methods of making the same, the various aspects of which are described below. An embodiment of the disclosure can be employed to form semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. Elements with the same reference numeral refer to a same element or a similar element, and are presumed to have the same composition unless explicitly noted otherwise.

As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, an "active region" refers to a source region of a field effect transistor or a drain region of a field effect transistor.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. Optionally, a portion of the substrate semiconductor layer 9 can be vertically recessed to provide a recessed region, and the at least one semiconductor device 700 may be formed in the recessed region. Alternatively, an additional semiconductor material may be added to the substrate semiconductor layer 9 outside a region of the at least one semiconductor device 700, for example, by selective epitaxy after formation of the at least one semiconductor device.

The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed.

The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9 in regions that do not include the at least one semiconductor device 700.

An optional semiconductor material layer 10 may be formed within, or on top of, the substrate semiconductor layer 9 by ion implantation of electrical dopants (such as p-type dopants or n-type dopants) and/or by deposition of a single crystalline semiconductor material, for example, by selective epitaxy. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 300. The region in which a memory array is subsequently formed is herein referred to as a memory array region 100. A contact region 200 for subsequently forming stepped terraces of electrically conductive layers can be provided between the memory array region 100 and the peripheral device region 300.

A gate dielectric layer 12 can be formed above the semiconductor material layer 10 and the planarization dielectric layer 170. The gate dielectric layer 12 can include, for example, a silicon oxide layer and/or a dielectric metal oxide layer (such as an aluminum oxide layer and/or a hafnium oxide layer). The thickness of the gate dielectric layer 12 can be in a range from 3 nm to 30 nm, although lesser and greater thicknesses can also be employed.

An alternating stack of first material layers and second material layers is subsequently formed. Each first material layer can include a first material, and each second material layer can include a second material that is different from the first material. In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. The alternating stack formed by the first insulating layers 132 and the first sacrificial material layers 142 is herein referred to as a first alternating stack (132, 142), or a lower alternating stack (132, 142). In this case, the stack can include an alternating plurality of first insulating layers 132 and first sacrificial material layers 142. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

A joint-level dielectric material layer 172 can be subsequently formed over the second alternating stack (232, 242). The joint-level dielectric material layer 172 includes a dielectric material that is different from the material of the first sacrificial material layers 142. The joint-level dielectric material layer 172 includes a dielectric material that may be the same as, or different from, the material of the first insulating layers 132. In one embodiment, the joint-level dielectric material layer 172 can include silicon oxide. In one embodiment, the thickness of the joint-level dielectric material layer 172 can be in a range from 20 nm to 100 nm, although lesser and greater thicknesses can also be employed. The first dielectric cap layer 172 can be thicker than each insulating layer 132, such as one to ten times thicker. The first alternating stack (132, 142) and the first dielectric cap layer 172 collectively constitutes a first tier structure (132, 142, 172).

Figure 2A:
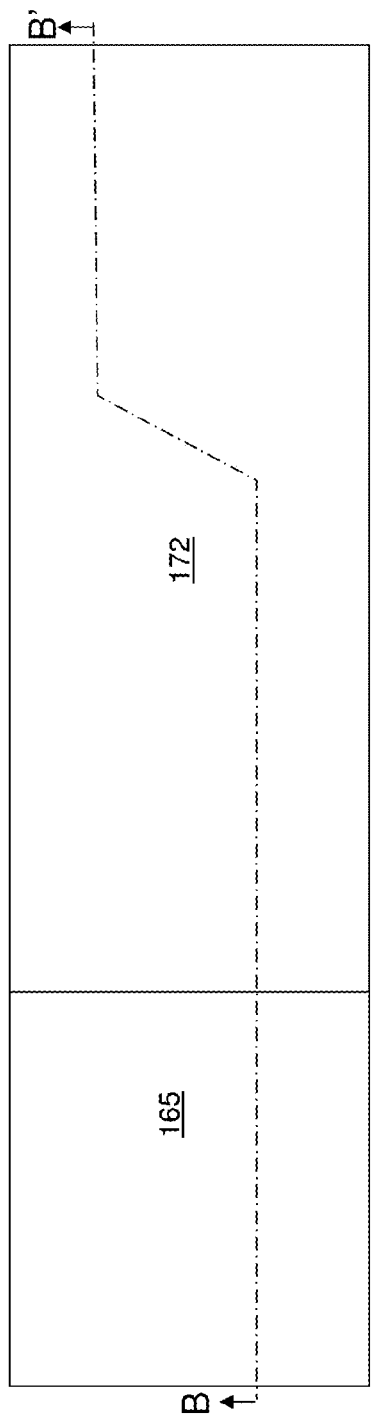
FIG. 2A is a top-down view of the exemplary structure after formation of a first alternating stack of first insulating layers and first sacrificial material layers, first stepped surfaces, and a first retro-stepped dielectric material portion according to an embodiment of the present disclosure.
Figure 2B:
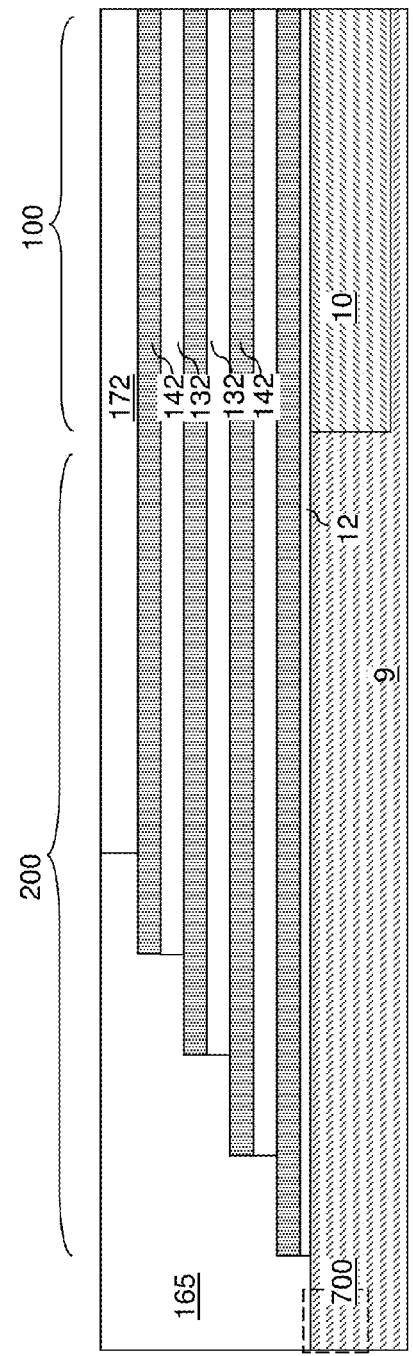
FIG. 2B is a vertical cross-sectional view of the exemplary structure of FIG. 2A along the vertical plane B-B'.

Referring to FIGS. 2A and 2B, the first tier structure (132, 142, 172) can be patterned to form first stepped surfaces. The first stepped surfaces form a first terrace region, which is located within an area of the contact region 200. The contact region 200 includes a first stepped area in which the first stepped surfaces are formed, and a second stepped area in which additional stepped surfaces are to be subsequently formed in an second tier structure (to be subsequently formed over the first tier structure). The memory array region 100 is provided adjacent to the contact region 200. Memory devices including memory stack structures can be subsequently formed in the memory array region 100. The first stepped surfaces can be formed, for example, by forming a mask layer with an opening therein, etching a cavity within the levels of the topmost first sacrificial material layer 142 and the topmost first insulating layer 132, and iteratively expanding the etched area and vertically recessing the cavity by etching each pair of a first insulating layer 132 and a first sacrificial material layer 142 located directly underneath the bottom surface of the etched cavity within the etched area. The joint-level dielectric material layer 172 and the first alternating stack (132, 142) are patterned such that each underlying first sacrificial material layer 142 laterally protrudes farther than any overlying first sacrificial material layer 142 in the etched region, and each underlying first insulating layer 132 laterally protrudes farther than any overlying first insulating layer 132 in the etched region. The contact region can be a contact region of the first alternating stack (132, 142). The cavity is herein referred to as a first stepped cavity.

A dielectric material is deposited to fill the first stepped cavity. Excess portions of the dielectric material overlying the topmost surface of the first alternating stack (132, 142), are removed for example, by chemical mechanical planarization. The remaining portion of the deposited dielectric material forms a first dielectric material portion, which is herein referred to as a first retro-stepped dielectric material portion 165. The first retro-stepped dielectric material portion 165 is formed on the first stepped surfaces. The first dielectric material portion 165 is retro-stepped. As used herein, a "retro-stepped" element refers to an element that has stepped surfaces and a horizontal cross-sectional area that increases monotonically as a function of a vertical distance from a top surface of a substrate on which the element is present. The first tier structure, which is also referred to as a first stack structure, comprises the first alternating stack (132, 142) and the first retro-stepped dielectric material portion 165. The first retro-stepped dielectric material portion 165 is incorporated into the first tier structure (132, 142, 172, 165).

Figure 3A:
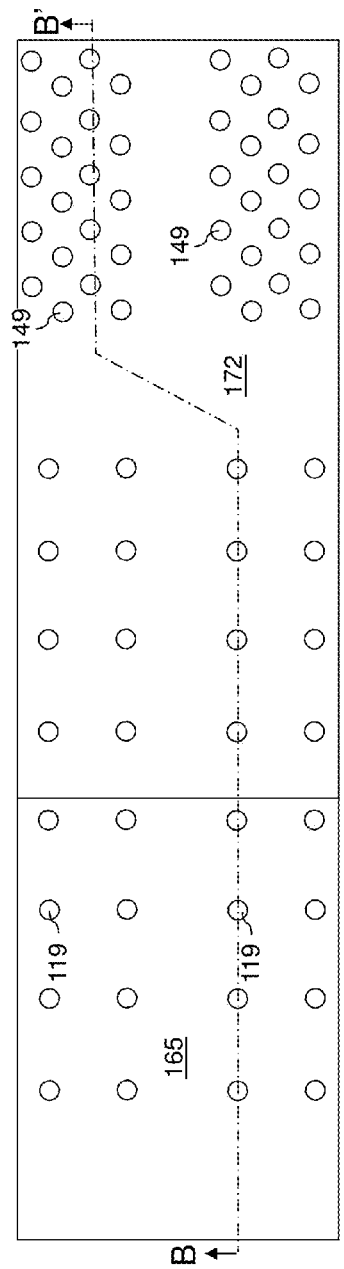
FIG. 3A is a top-down view of the exemplary structure after formation of first-tier memory openings in a memory array region and first-tier support openings in a contact region according to an embodiment of the present disclosure.
Figure 3B:
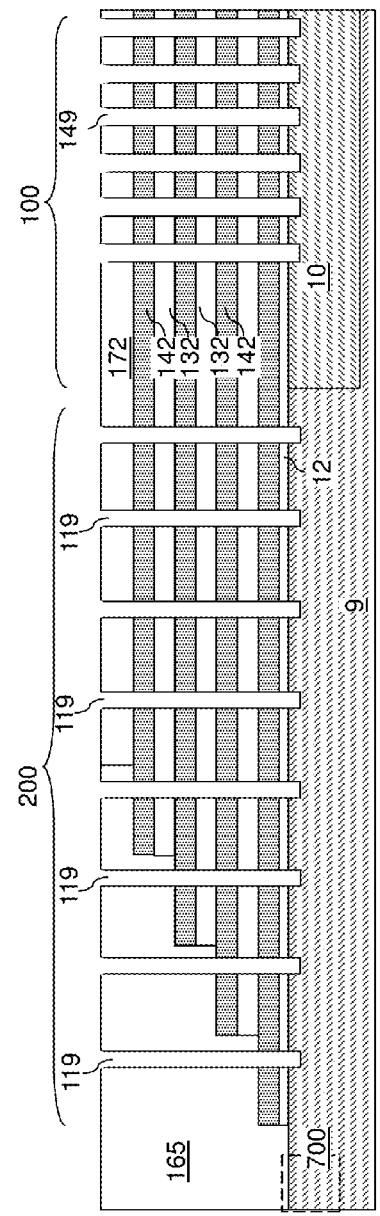
FIG. 3B is a vertical cross-sectional view of the exemplary structure of FIG. 3A along the vertical plane B-B'.

Referring to FIGS. 3A and 3B, first-tier openings (149, 119) extending to a top surface of the substrate (9, 10) are formed through the first tier structure (132, 142, 172, 165). The first-tier openings (149, 119) include first-tier memory openings 149 that are formed in the memory array region 100 and first-tier support openings 119 that are formed in the contact region 200. The first-tier memory openings 149 and the first-tier support openings 119 can be formed concurrently by a patterning process. To form the first-tier openings (149, 119), a lithographic material stack (not shown) including at least a photoresist layer can be formed over the first tier structure (132, 142, 172, 165), and can be lithographically patterned to form openings within the lithographic material stack. The pattern in the lithographic material stack can be transferred through the entirety of the first tier structure (132, 142, 172, 165) by at least one anisotropic etch that employs the patterned lithographic material stack as an etch mask. Portions of the first tier structure (132, 142, 172, 165) underlying the openings in the patterned lithographic material stack are etched to form the first-tier openings (149, 119). In other words, transfer of the pattern in the patterned lithographic material stack through the first tier structure (132, 142, 172, 165) forms the first-tier openings (149, 119).

In one embodiment, the chemistry of the anisotropic etch process employed to etch through the materials of the first alternating stack (132, 142) can alternate to optimize etching of the first and second materials in the first alternating stack (132, 142) while providing a comparable average etch rate for the first dielectric material portion 165. The anisotropic etch can be, for example, a series of reactive ion etches. The sidewalls of the first-tier openings (149, 119) can be substantially vertical, or can be tapered. Subsequently, the patterned lithographic material stack can be subsequently removed, for example, by ashing. The first-tier memory openings 149 and the first-tier support openings 119 can be formed concurrently employing the same set of anisotropic etch processes.

In one embodiment, the substrate (9, 10) can be employed as a stopping layer for the anisotropic etch process. In one embodiment, the first-tier openings (149, 119) may extend below the top surface of the substrate (9, 10) by an overetch. The lateral dimensions (e.g., a diameter) of the first-tier openings (149, 119) can be from about 20 nm to 200 nm at an upper portion of each first-tier opening (149, 119), and can be about 10 nm to 150 nm at a lower portion of each first-tier opening (149, 119).

In one embodiment, the first-tier memory openings 149 can be formed as an array of openings, which can be a periodic two-dimensional array of openings. The first-tier support openings 119 can be formed as discrete openings that are mutually separated from one another, and may, or may not, form a periodic two-dimensional array pattern. In one embodiment, the first-tier support openings 119 may form a plurality of periodic one-dimensional array patterns that are parallel among one another.

FIGS. 4A-4H illustrate sequential vertical cross-sectional views of a first-tier memory opening 149 within the exemplary structure up to the processing step of formation of sacrificial fill material portions of the present disclosure. Referring to FIG. 4A, a first-tier memory opening 149 in the exemplary device structure of FIGS. 3A and 3B is illustrated. The first-tier memory opening 149 extends through the joint-level dielectric material layer 172, the first alternating stack (132, 142), the gate dielectric layer 12, and optionally into an upper portion of the semiconductor material layer 10. At this processing step, each first-tier support opening 19 can extend through the first retro-stepped dielectric material portion 165, a subset of layers in the first alternating stack (132, 142), the gate dielectric layer 12, and optionally through the upper portion of the semiconductor material layer 10. The recess depth of the bottom surface of each first-tier memory opening 149 with respect to the top surface of the semiconductor material layer 10 can be in a range from 0 nm to 30 nm, although greater recess depths can also be employed. Optionally, the first sacrificial material layers 142 can be laterally recessed partially to form lateral recesses (not shown), for example, by an isotropic etch.

Referring to FIG. 4B, an optional epitaxial channel portion (e.g., an epitaxial pedestal) 11 can be formed at the bottom portion of each first-tier memory opening 149 and each first-tier support openings 119, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a first sacrificial material layer 142. In this case, at least one source select gate electrode can be subsequently formed by replacing each first sacrificial material layer 142 located below the horizontal plane including the top surfaces of the epitaxial channel portions 11 with a respective conductive material layer. The epitaxial channel portion 11 can be a portion of a transistor channel that extends between a source region to be subsequently formed in the substrate (9, 10) and a drain region to be subsequently formed in an upper portion of the first-tier memory opening 149. A first-tier memory cavity 149' is present in the unfilled portion of the first-tier memory opening 149 above the epitaxial channel portion 11. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts. If a semiconductor material layer 10 is not present, the epitaxial channel portion 11 can be formed directly on the substrate semiconductor layer 9, which can have a doping of the first conductivity type.

Referring to FIG. 4C, a dielectric liner layer 121L can be formed on the sidewalls of the first-tier openings (149, 119) and over the joint-level dielectric material layer 172 by conformal deposition of a dielectric material. The dielectric liner layer 121L includes a dielectric material such as silicon oxide or silicon nitride. For example, the dielectric liner layer 121L can include silicon oxide, and can have a thickness in a range from 2 nm to 20 nm, although lesser and greater thicknesses can also be employed.

Referring to FIG. 4D, a first sacrificial fill material is deposited in the first-tier cavities (i.e., unfilled volumes of the first-tier openings (149, 119)). The first sacrificial fill material can include a doped or undoped semiconductor material (such as polysilicon, amorphous silicon, or a silicon-germanium alloy), porous or non-porous organosilicate glass (OSG), an inorganic polymer material (such as a silicon-based polymer material), amorphous carbon or diamond-like carbon (DLC), or another material that can be subsequently removed selective to the dielectric liner layer 121L in a subsequent etch process. In one embodiment, the first sacrificial fill material layer can include amorphous silicon or polysilicon. The first sacrificial fill material can be removed from above the horizontal plane including the top surface of the dielectric liner layer 121L by a planarization process such as a recess etch and/or chemical mechanical planarization (CMP). Each remaining portion of the first sacrificial fill material constitutes a first sacrificial fill material portion 122. Each first sacrificial fill material portion 122 can be formed on the dielectric liner layer 121L.

Referring to FIG. 4E, a recess etch can be performed such that the top surface of each first sacrificial fill material portion 122 is vertically recessed to a level of the joint-level dielectric material layer 172, i.e., between a first horizontal plane including the top surface of the joint-level dielectric material layer 172 and a second horizontal plane including the bottom surface of the joint-level dielectric material layer 172. If a recess etch is employed to remove the first sacrificial fill material from above the horizontal plane including the top most surface of the dielectric liner layer 121L, the recess etch can be continued until the top surfaces of the first sacrificial fill material portions 122 reach a target recess depth.

A dielectric material layer (which is herein referred to as a spacer dielectric material layer) can be conformally deposited over the first sacrificial fill material portions 122 and the joint-level dielectric material layer 172, and can be anisotropically etched to form an annular dielectric spacer 124 on a top surface of each first sacrificial fill material portion 122. The annular dielectric spacers 124 includes a dielectric material such as silicon oxide or silicon nitride. In one embodiment, the annular dielectric spacers 124 can include undoped silicate glass deposited by low pressure chemical vapor deposition and optically densified by an anneal. Alternatively, the annular dielectric spacer 124 can include silicon nitride. As used herein, an "annular" element refers to an element that is topologically homeomorphic to a torus. As used herein, an element is "topologically homeomorphic" to a shape if the element can be continuously deformed without forming a new opening or destroying any pre-existing opening into the shape.

In each annular dielectric spacer 124, the lateral distance between the inner sidewall and the outer sidewall of the annular dielectric spacer 124 can be uniform. Each annular dielectric spacer 124 can be formed at a level of the joint-level dielectric material layer 172, i.e., between a first horizontal plane including the top surface of the joint-level dielectric material layer 172 and a second horizontal plane including the bottom surface of the joint-level dielectric material layer 172. In one embodiment, the lateral thickness of each annular dielectric spacer 124, as measured between an inner sidewall and a most proximal portion of the outer sidewall, can be in a range from 3% to 30% of the least lateral extent of the top surface of the underlying first sacrificial fill material portion 122. The least lateral extent of the top surface of the underlying first sacrificial fill material portion 122 may be the diameter if the top surface of the underlying first sacrificial fill material portion 122 has a shape of a circle, or a minor axis if the top surface of the underlying first sacrificial fill material portion 122 has a shape of an ellipse. In one embodiment, the lateral thickness of each annular dielectric spacer 124 may be in a range from 3 nm to 150 nm, although lesser and greater thicknesses can also be employed.

Each annular dielectric spacer 124 can include a tapered inner sidewall that has a closed upper periphery that adjoined a closed upper periphery of a vertical outer sidewall, and has a closed lower periphery that adjoins a closed upper periphery of a vertical inner sidewall. Thus, each annular dielectric spacer 124 can include a vertical inner sidewall that is adjoined to a tapered inner sidewall. Further, each annular dielectric spacer 124 can have an annular bottom surface that adjoins the bottom periphery of the inner vertical sidewall of the annular dielectric spacer 124 and adjoins the bottom periphery of the outer vertical sidewall of the annular dielectric spacer 124.

Referring to FIG. 4F, a second sacrificial fill material can be deposited within the recessed regions inside the first-tier memory openings 149 and the first-tier support openings 119, and can be vertically recessed to form second sacrificial fill material portions 126. The second sacrificial fill material can include a doped or undoped semiconductor material (such as polysilicon, amorphous silicon, or a silicon-germanium alloy), porous or non-porous organosilicate glass (OSG), an inorganic polymer material (such as a silicon-based polymer material), amorphous carbon or diamond-like carbon (DLC), or another material that can be subsequently removed selective to annular dielectric spacers 124 in a subsequent etch process. The second sacrificial fill material may be the same as, or may be different from, the first sacrificial fill material. In one embodiment, the second sacrificial fill material layer can include amorphous silicon or polysilicon. Excess portions of the second sacrificial fill material can be removed from above the top portions of the annular dielectric spacers 124 by a recess etch. Each remaining portion of the second sacrificial fill material constitutes a second sacrificial fill material portion 124. Each second sacrificial fill material portion 126 can be formed on an underlying first fill material portion 122 and within, and directly on, an annular dielectric spacer 124.

Referring to FIG. 4G, an isotropic etch process that isotropically etches the material of the joint-level dielectric material layer 172 can be performed. The chemistry of the isotropic etch process can be selective to the second sacrificial fill material. Thus, the isotropic etch process etches surface portions of the joint-level dielectric material layer 172 preferentially over the second sacrificial material portions 126. The isotropic etch process collaterally etches the material of the physically exposed portions of the dielectric liner layer 121L. Further, the isotropic etch process may collaterally etch the top portions of the annular dielectric spacers 124.

Specifically, a top surface of the joint-level dielectric material layer 172 and each portion of the sidewalls of the joint-level dielectric material layer 172 that is not covered by the annular dielectric spacer can be isotropically etched during the isotropic etch process. In one embodiment, an upper portion of each annular dielectric spacer 124 that is not covered by the second sacrificial fill material portion 126 can be isotropically recessed during the isotropic etch process. In an illustrative example, the isotropic etch process can include a wet etch employing dilute hydrofluoric acid or a dry etch employing HF vapor, and the joint-level dielectric material layer 172 can include silicon oxide or a doped silicate glass (such as borosilicate glass) that has a greater etch rate than undoped silicon dioxide. In this case, the dielectric liner layer 121L can include a silicon oxide material, and the annular dielectric spacers 124 can include densified silicon oxide having a lower etch rate than the material of the joint-level dielectric material layer 172, or can include silicon nitride.

A flare region FR is formed at a top portion of each first-tier opening (149, 119) which has a larger width (e.g., diameter) than the bottom portion of each first-tier opening (149, 119). The flare region can include a circumferential vertical sidewall and an optional circumferential tapered sidewall or a horizontal wall that is adjoined to the bottom of the circumferential vertical sidewall. As used herein, a "circumferential" element refers to an element having an enclosing boundary, i.e., a boundary having a closed shape. The lateral offset distance LOD between the outer sidewall of the dielectric liner layer 121L and the circumferential vertical sidewall can be in a range from 1% to 50% of the least lateral extent of the top surface of the first sacrificial fill material portion 122. In one embodiment, the lateral offset distance LOD may be in a range from 1 nm to 250 nm, although lesser and greater thicknesses can also be employed.

Referring to FIG. 4H, a third sacrificial fill material can be deposited within the flare regions FR inside the first-tier memory openings 149 and the first-tier support openings 119, and can be planarized to form third sacrificial fill material portions 128. The third sacrificial fill material can include a doped or undoped semiconductor material (such as polysilicon, amorphous silicon, or a silicon-germanium alloy), porous or non-porous organosilicate glass (OSG), an inorganic polymer material (such as a silicon-based polymer material), amorphous carbon or diamond-like carbon (DLC), or another material that can be subsequently removed selective to annular dielectric spacers 124 in a subsequent etch process. The third sacrificial fill material may be the same as, or may be different from, the first sacrificial fill material and/or the second sacrificial fill material. In one embodiment, the third sacrificial fill material layer can include amorphous silicon or polysilicon. Excess portions of the third sacrificial fill material can be removed from above the top surface of the joint-level dielectric material layer 172 by a planarization process, which can employ chemical mechanical planarization (CMP) and/or a recess etch. Each remaining portion of the third sacrificial fill material constitutes a third sacrificial fill material portion 128. Each third sacrificial fill material portion 128 can be formed on an underlying second sacrificial fill material portion 126, on a surface of a annular dielectric spacer 124, and on a sidewall of the joint-level dielectric material layer 172. Each contiguous set of a first sacrificial fill material portion 122, a second sacrificial fill material portion 126, a third sacrificial fill material portion 128, and a dielectric liner layer 121L in a first-tier memory opening 149 or a first-tier support opening 119 constitutes a sacrificial fill material structure (121L, 122, 126, 128).

Referring to FIGS. 5A and 5B, the exemplary structure is illustrated after formation of the sacrificial fill material structures (121L, 122, 126, 128). Each instance of the sacrificial fill material structure (121L, 122, 126, 128) within a first-tier memory opening 149 is herein referred to as a sacrificial memory opening fill structure 57. Each instance of the sacrificial fill material structure (121L, 122, 126, 128) within a first-tier support openings 119 is herein referred to as a sacrificial support opening fill structure 17. The sacrificial memory opening fill structures 57 can be arranged as a plurality of two-dimensional periodic arrays in the memory array region 100. Likewise, the sacrificial support opening fill structures 17 can be arranged as a plurality of two-dimensional periodic arrays in the contact region 200.

Figure 6A:
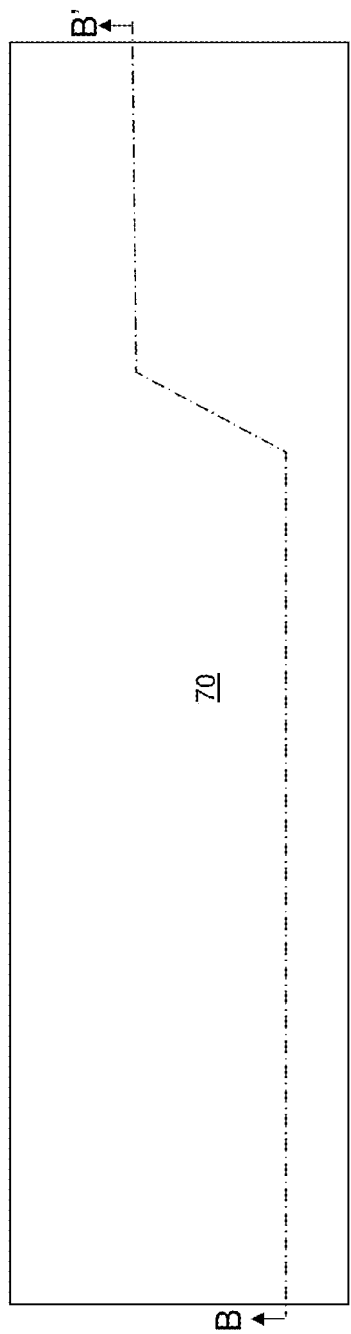
FIG. 6A is a top-down view of the exemplary structure after formation of a second alternating stack of second insulating layers and second sacrificial material layers according to an embodiment of the present disclosure.
Figure 6B:
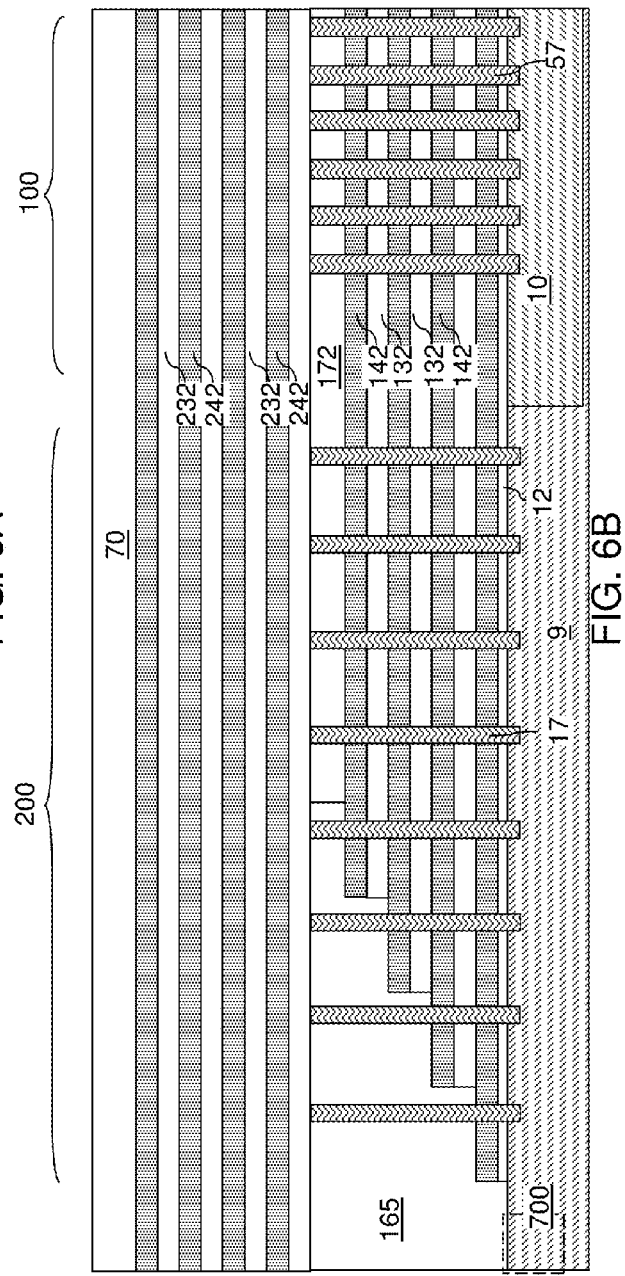
FIG. 6B is a vertical cross-sectional view of the exemplary structure of FIG. 6A along the vertical plane B-B'.

Referring to FIGS. 6A and 6B, a second alternating stack (232, 242) of material layers is subsequently formed on the top surface of the first tier structure (132, 142, 172, 165). The second alternating stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers and the fourth material layers can be second insulating layers 232 and second sacrificial material layers 242, respectively. The third material of the second insulating layers 232 can be at least one insulating material. The fourth material of the second sacrificial material layers 242 is a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second alternating stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material. For example, the first and second sacrificial material layers (142, 242) can include silicon nitride, and the first and second insulating layers (132, 232) can include silicon oxide.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second alternating stack (232, 242) can have a uniform thickness that is substantially invariant within each respective second sacrificial material layer 242.

A dielectric cap layer 70 can be subsequently formed over the second alternating stack (232, 242). The dielectric cap layer 70 includes a dielectric material that is different from the material of the second sacrificial material layers 242. The dielectric cap layer 70 includes a dielectric material that may be the same as, or different from, the material of the second insulating layers 232. In one embodiment, the dielectric cap layer 70 can include silicon oxide. The second alternating stack (232, 242) and the dielectric cap layer 70 constitute a second tier structure (232, 242, 70).

Figure 7A:
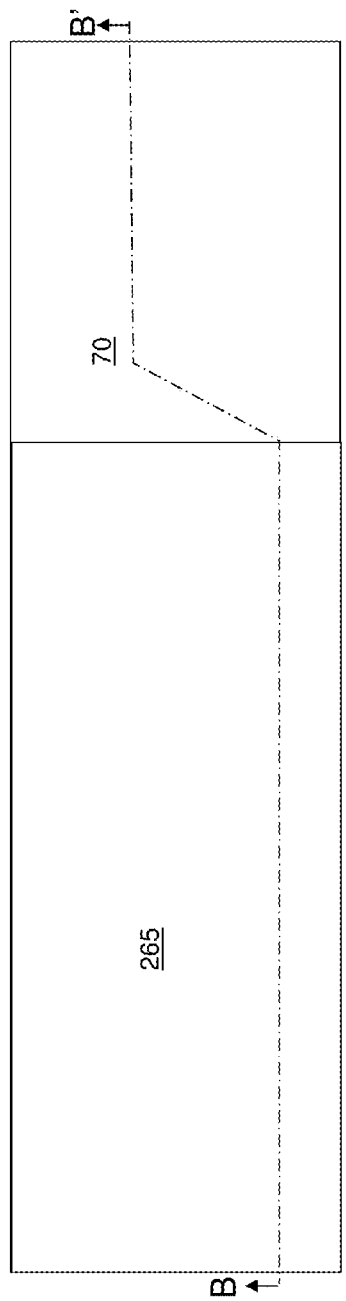
FIG. 7A is a top-down view of the exemplary structure after formation of second stepped surfaces and a second retro-stepped dielectric material portion according to an embodiment of the present disclosure.
Figure 7B:
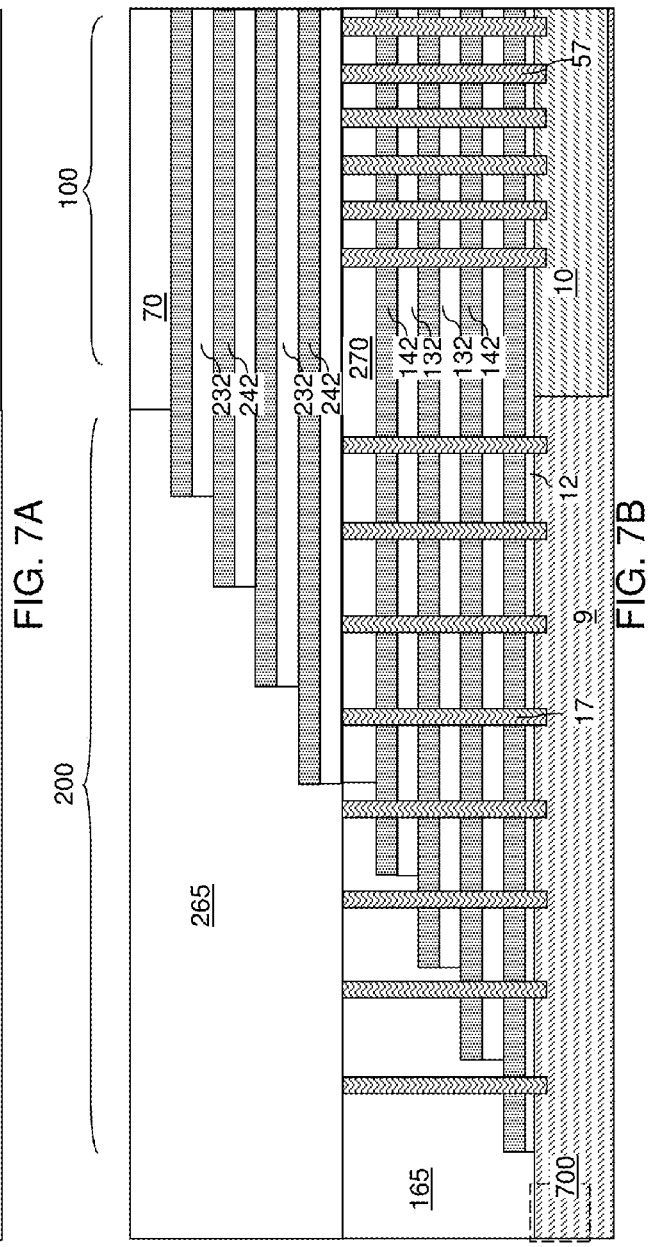
FIG. 7B is a vertical cross-sectional view of the exemplary structure of FIG. 7A along the vertical plane B-B'.

Referring to FIGS. 7A and 7B, additional stepped surfaces are formed in the second alternating stack (232, 242) in the contact region 200. The additional stepped surfaces are herein referred to as second stepped surfaces. The second stepped surfaces are formed in a second stepped area, which is adjacent to, and does not overlie, the first stepped area of the first stepped surfaces within the first tier structure (132, 142, 172, 165). The second stepped surfaces can be adjacent to, and do not overlie, the stepped interface between the first alternating stack (132, 142) and the first retro-stepped dielectric material portion 165.

The second stepped surfaces can be formed, for example, by forming a mask layer with an opening therein, etching a cavity within the levels of the topmost second sacrificial material layer 242 and the topmost second insulating layer 232, and iteratively expanding the etched area and vertically recessing the cavity by etching a pair of a second insulating layer 232 and a second sacrificial material layer 242 located directly underneath the bottom surface of the etched cavity within the etched area. The second alternating stack (232, 242) is patterned such that each underlying second sacrificial material layer 242 laterally protrudes farther than any overlying second sacrificial material layer 242 in the etched region, and each underlying second insulating layer 232 laterally protrudes farther than any overlying second insulating layer 232 in the etched region. The etched area includes the area of the contact region 200, which includes the contact area for the second alternating stack (232, 242) and a contact area for the first alternating stack (132, 142).

Thus, the second alternating stack (232, 242) is patterned to form the second stepped surfaces thereupon. The cavity formed by removal of portions of the second alternating stack (232, 242) is herein referred to as a second stepped cavity. The area of the second stepped cavity includes the area of the first retro-stepped first dielectric material portion 165, from which all layers of the second alternating stack (232, 242) are removed. The area of the second stepped cavity further includes the area of the second stepped surfaces of the second alternating stack (232, 242).

Dielectric material is deposited to fill the second stepped cavity. Excess portions of the dielectric material overlying the topmost surface of the second alternating stack (232, 242) are removed, for example, by chemical mechanical planarization. The remaining portion of the deposited dielectric material is retro-stepped, and thus, forms a second dielectric material portion, which is herein referred to as a second retro-stepped dielectric material portion 265. The second retro-stepped dielectric material portion 265 is located on, and over, the second stepped surfaces of the second alternating stack (232, 242). The second retro-stepped dielectric material portion 265 is formed on the second stepped surfaces. The contact region 200 comprises a region of the first stepped surfaces and a region of the second stepped surfaces. Upon formation of the second retro-stepped dielectric material portion 265, the second retro-stepped dielectric material portion 265 is incorporated into the second tier structure (232, 242, 70, 265), i.e., becomes an element of the second tier structure (232, 242, 70, 265).

The first stepped surfaces and the second stepped surfaces are collectively referred to as "stepped surfaces." A first portion of the stepped surfaces is the first stepped surfaces located in the first tier structure (132, 142, 172, 165). As second portion of the stepped surfaces is the second stepped surfaces located in the second tier structure (232, 242, 70, 265). The first stepped surfaces and the second stepped surfaces are located within the contact region 200.

The region of the stepped surfaces is herein referred to as a terrace region. Each sacrificial material layer (142, 242) among the first and second sacrificial material layers (142, 242) that is not a bottommost first sacrificial material layer 142 laterally extends less than any underlying layer among the first and second sacrificial material layers (142, 242). The terrace region includes stepped surfaces of the first and second alternating stacks (132, 142, 232, 242) that continuously extend from a bottommost layer within the first alternating stack (132, 142) to a topmost layer within the second alternating stack (232, 242).

Figure 8A:
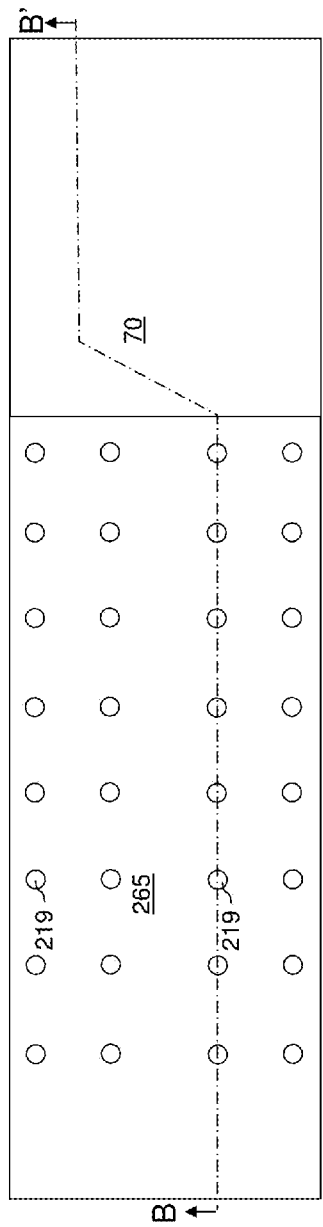
FIG. 8A is a top-down view of the exemplary structure after formation of second-tier memory openings and second-tier support openings according to an embodiment of the present disclosure.
Figure 8B:
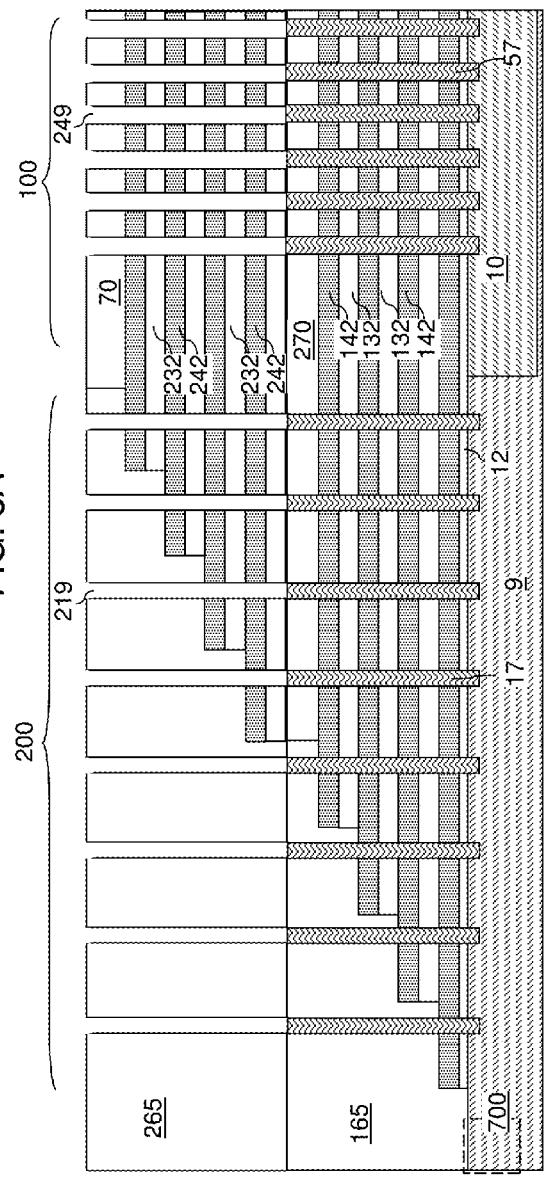
FIG. 8B is a vertical cross-sectional view of the exemplary structure of FIG. 8A along the vertical plane B-B'.

Referring to FIGS. 8A and 8B, second-tier openings (249, 219) are formed through the second tier structure (232, 242, 265, 70) to the top surface of the first tier structure (132, 142, 172, 165). The second-tier openings (249, 219) include second-tier memory openings 249 that are formed in the memory array region 100 and second-tier support openings 219 that are formed in the contact region 200.

The second-tier memory openings 249 are formed through the second tier structure (232, 242, 70, 265) in areas that overlap with the first-tier memory openings 149, i.e., with the sacrificial memory opening fill structures 57. Thus, each second-tier memory opening 249 can be formed on top of a respective sacrificial memory opening fill structure 57 (which are present in the first-tier memory opening 149). In one embodiment, the bottom surface of each second-tier memory opening 249 can be formed within a periphery of a top surface of an underlying sacrificial memory opening fill structure 57, i.e., can have an areal overlap with the top surface of the underlying sacrificial memory opening fill structure 57. The second-tier support openings 219 are formed through the second tier structure (232, 242, 70, 265) such that each second-tier support opening 219 is formed in an area that overlaps with the area of an underlying sacrificial support opening fill structure 17. In one embodiment, the same lithographic mask may be employed to pattern the first-tier openings (149, 119) and the second-tier openings (249, 219).

The second-tier openings (249, 219) can be formed by a combination of lithographic patterning and an anisotropic etch. For example, a lithographic material stack (not shown) including at least a photoresist layer can be formed over the second tier structure (232, 242, 265, 70), and can be lithographically patterned to form openings within the lithographic material stack. The pattern in the lithographic material stack can be transferred through the entirety of the second tier structure (232, 242, 265, 70) by at least one anisotropic etch that employs the patterned lithographic material stack as an etch mask. Portions of the second tier structure (232, 242, 265, 70) underlying the openings in the patterned lithographic material stack are etched to form the second-tier openings (249, 219). In other words, transfer of the pattern in the patterned lithographic material stack through the second tier structure (232, 242, 265, 70) forms the second-tier openings (249, 219).

In one embodiment, the chemistry of the anisotropic etch process employed to etch through the materials of the second alternating stack (232, 242) can alternate to optimize etching of the third and fourth materials in the second alternating stack (232, 242) while providing a comparable average etch rate for the second dielectric material portion 265. The anisotropic etch can be, for example, a series of reactive ion etches. The sidewalls of the second-tier openings (249, 219) can be substantially vertical, or can be tapered.

The lateral dimensions (e.g., a diameter) of the second-tier openings (249, 219) can be comparable to the lateral dimensions of the first-tier openings (149, 119). For example, the lateral dimensions of the second-tier openings (249, 219) can be from about 20 nm to 200 nm at an upper portion of each second-tier opening (249, 219), and can be about 10 nm to 150 nm at a lower portion of each second-tier opening (249, 219). In one embodiment, the second-tier memory openings 249 and the first-tier memory openings 149 can be formed as an array of openings, which can be a periodic two-dimensional array of openings. The second-tier support openings 219 and the first-tier support openings 119 can be formed as discrete openings that are mutually separated from one another, and may, or may not, form a periodic two-dimensional array pattern. Subsequently, the patterned lithographic material stack can be subsequently removed, for example, by ashing.

Figure 10A:
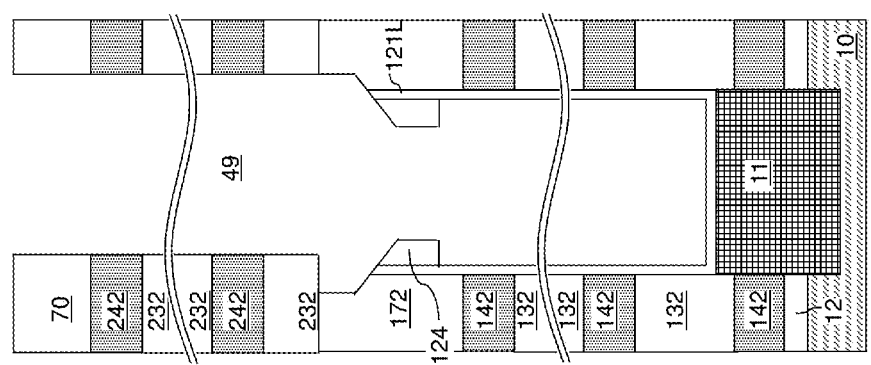
FIG. 10A is a vertical cross-sectional view of a region including a vertically neighboring pair of a first-tier memory opening and a second-tier memory opening of the exemplary structure after formation of second-tier memory openings for the case of maximum misalignment according to an embodiment of the present disclosure.

FIGS. 9A-9H are sequential vertical cross-sectional views of a vertically neighboring pair of a first-tier memory opening and a second-tier memory opening during formation of a memory opening fill structure for the case of a perfect alignment between the second-tier memory opening and the first-tier memory opening. FIGS. 10A-10H are sequential vertical cross-sectional views of a vertically neighboring pair of a first-tier memory opening and a second-tier memory opening during formation of a memory opening fill structure for the case of a maximum misalignment between the second-tier memory opening and the first-tier memory opening. FIG. 10I is a horizontal cross-sectional view of the structure of FIG. 10F along the horizontal cross-sectional plane I-I'. During the processing steps of FIGS. 9A-9H and 10A-10H, a support pillar structure including a same set of components as a memory opening fill structure (with optional modifications in dimensions) can be formed in each vertically neighboring pair of a first-tier support opening and a second-tier support opening.

FIGS. 9A and 10A are vertical cross-sectional views of a region including a vertically neighboring pair of a first-tier memory opening and a second-tier memory opening 249 of the exemplary structure after formation of second-tier memory openings 249. As discussed above, the area of the bottom surface of the second-tier memory opening 249 can be within the periphery of the top surface of an underlying sacrificial memory opening fill structure 57. Specifically, the area of the bottom surface of the second-tier memory opening 249 can be within the periphery of the top surface of an underlying third sacrificial fill material portion 128. Likewise, the area of the bottom surface of the second-tier support opening 219 can be within the periphery of the top surface of an underlying sacrificial support opening fill structure 17.

Figure 10B:
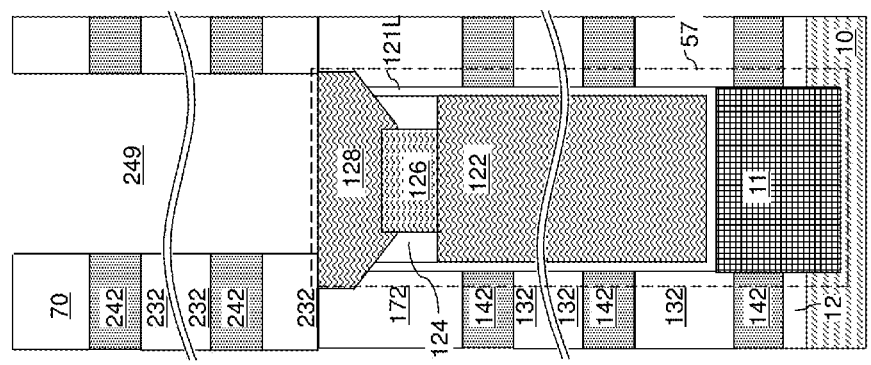
FIG. 10B is a vertical cross-sectional view of the region of the exemplary structure after formation of a through-tier memory opening by removal of sacrificial fill material portions for the case of maximum misalignment according to an embodiment of the present disclosure.

Referring to FIGS. 9B and 10B, the sacrificial fill material portions (128, 126, 122) can be removed selective to the annular dielectric spacer 124, the dielectric liner layer 121L, the joint-level dielectric material layer 172, the materials of the second alternating stack (232, 242), and the dielectric cap layer 70. A selective dry etch process with an optional isotropic etch component or a selective wet etch process can be employed to remove the sacrificial fill material portions (128, 126, 122). For example, if the first, second, and third sacrificial fill material portions (122, 126, 128) include amorphous silicon or polysilicon, the annular dielectric spacer 124, the dielectric liner layer 121L, the joint-level dielectric material layer 172, the second insulating layers 232, and the dielectric cap layer 70 include silicon oxide-based materials (e.g., silicon dioxide), and the second sacrificial material layers 242 include silicon nitride, an anisotropic reactive ion etch process employing $CF_4$ and $O_2$, an isotropic dry etch process employing HCl vapor, or a wet etch process employing a KOH solution can be employed to etch the sacrificial fill material portions (128, 126, 122) selective to the annular dielectric spacer 124, the dielectric liner layer 121L, the joint-level dielectric material layer 172, the materials of the second alternating stack (232, 242), and the dielectric cap layer 70.

A memory opening 49, which is also referred to as an inter-tier memory opening, is formed by removal of the sacrificial fill material portions (128, 126, 122) from each first-tier memory opening 149. Each memory opening 49 includes an entire volume of a second-tier memory opening 249 and a predominant portion of the entire volume of an underlying first-tier memory opening 149 that excludes the volume of a respective annular dielectric spacer 124 and the volume of a respective dielectric liner layer 121L. As used herein, a "predominant" portion refers to a portion that includes more than one half of the entire portion. Likewise, a support opening, which is also referred to as an inter-tier support opening, is formed by removal of the sacrificial fill material portions (128, 126, 122) from each first-tier support opening 119. Each support openings includes an entire volume of a second-tier support opening 219 and a predominant portion of the entire volume of an underlying first-tier support opening 119 that excludes the volume of a respective annular dielectric spacer 124 and the volume of a respective dielectric liner layer 121L.

Figure 10D:
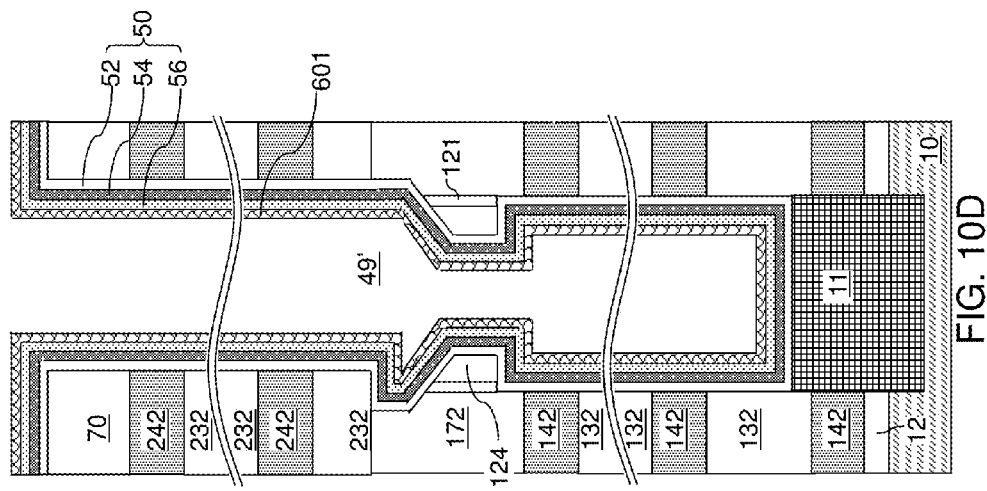
FIG. 10D is a vertical cross-sectional view of the region of the exemplary structure after formation of a memory film for the case of maximum misalignment according to an embodiment of the present disclosure.
Figure 10C:
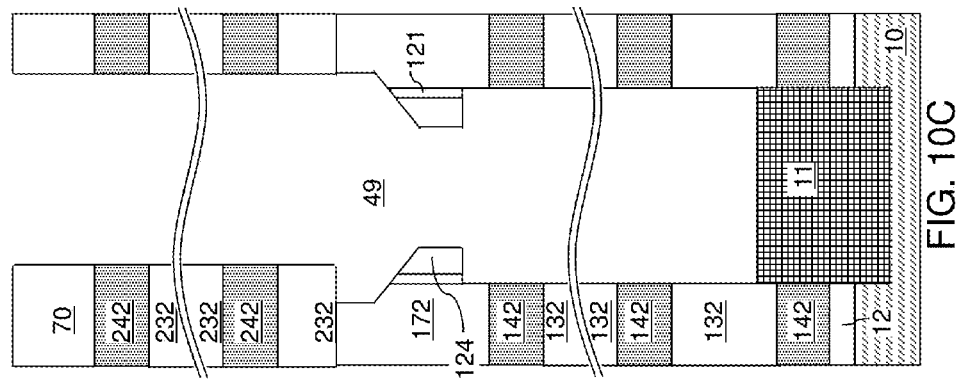
FIG. 10C is a vertical cross-sectional view of the region of the exemplary structure after etching physically exposed portions of the dielectric liner layer for the case of maximum misalignment according to an embodiment of the present disclosure.

Referring to FIGS. 9C and 10C, physically exposed portions of the dielectric liner layer 121L can be removed by an isotropic etch process. The annular dielectric spacer 124 can covers an annular portion of the dielectric liner layer 121L during removal of the physically exposed portions of the dielectric liner layer 121L from below the annular dielectric spacer 124. Each remaining portion of the dielectric liner layer 121L constitutes an annular dielectric liner 121 that contacts an outer sidewall of an annular dielectric spacer 124 and laterally surrounds the annular dielectric spacer 124. A top surface of the epitaxial channel portion 11 can be physically exposed at the bottom of each memory opening 49. If the epitaxial channel portions 11 are not employed, a top surface of the semiconductor material layer 10 can be physically exposed at the bottom of each memory opening 49.

Referring to FIGS. 9D and 10D, a memory film 50 and an optional cover material layer 601 can be formed in each memory opening 49 and in each support opening. The memory film 50 can be formed directly on all physically exposed surfaces of the annular dielectric spacer 124 within each memory opening 49 and within each support opening. The physically exposed surfaces of the annular dielectric spacer 124 includes the horizontal annular bottom surface, a circumferential vertical inner sidewall, and a circumferential tapered inner sidewall of the annular dielectric spacer 124. The memory film 50 can include, from outside to inside, a blocking dielectric layer 52, a charge storage layer 54, and a tunneling dielectric layer 56. Thus, a stack of layers including a blocking dielectric layer 52, a charge storage layer 54, a tunneling dielectric layer 56, and an optional cover material layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional cover material layer 601 may include a permanent material (i.e., a material at least a portion of which remains in a final device) or a sacrificial material (i.e., a material that is subsequently removed). The permanent material for the cover material layer 601 can be a semiconductor material. If the cover material layer 601 includes a permanent material, the cover material layer 601 can be employed as a component of a vertical semiconductor channel, and is referred to as an outer vertical semiconductor channel. In this case, the semiconductor material of the cover material layer 601 can include at least one elemental semiconductor material, at least one III-V compound semiconductor material, at least one II-VI compound semiconductor material, at least one organic semiconductor material, or other semiconductor materials known in the art. In one embodiment, the cover material layer 601 includes amorphous silicon or polysilicon.

Alternatively, the cover material layer 601 can include a sacrificial material that can be subsequently removed. Sacrificial materials that can be employed for the cover material layer 601 include, for example, amorphous carbon, amorphous silicon, polysilicon, a silicon-based polymer, or another material that can be removed selective to the material of the tunneling dielectric layer 56.

The cover material layer 601 can be formed by a conformal deposition method such as low pressure chemical vapor deposition (LPCVD). The thickness of the cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601). The optional cover material layer 601 and the memory film 50 can include a neck region, which is a region having the least lateral extent and is laterally bounded by the inner sidewall of the annular dielectric spacer 124.

Figure 10F:
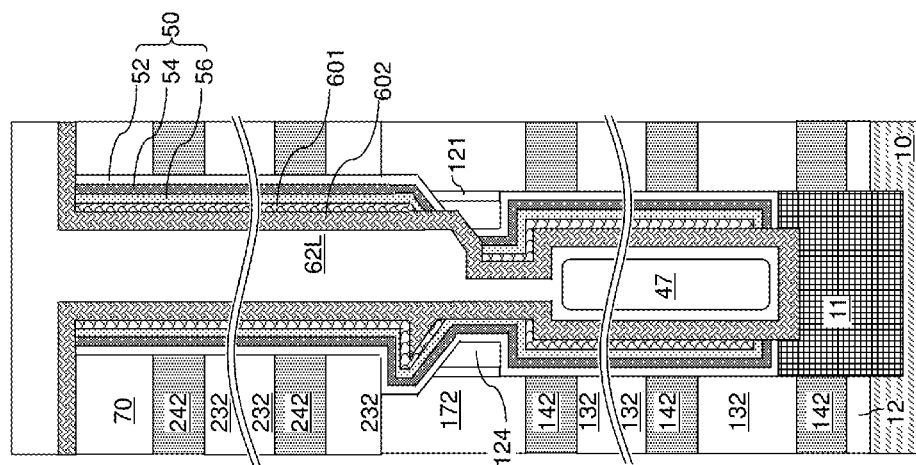
FIG. 10F is a vertical cross-sectional view of the region of the exemplary structure after formation of a vertical semiconductor channel and a dielectric core layer for the case of maximum misalignment according to an embodiment of the present disclosure.
Figure 10E:
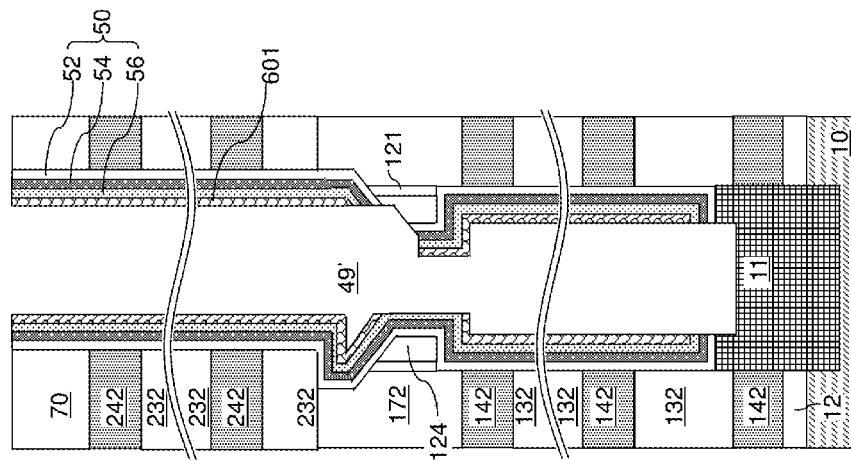
FIG. 10E is a vertical cross-sectional view of the region of the exemplary structure after an anisotropic etch that anisotropically etches the memory film for the case of maximum misalignment according to an embodiment of the present disclosure.

Referring to FIGS. 9E and 10E, the optional cover material layer 601, the tunneling dielectric layer 56, the charge storage layer 54, the blocking dielectric layer 52 are sequentially anisotropically etched employing at least one anisotropic etch process. Horizontal portions of the cover material layer 601 and the memory film 50 are etched, and a tapered portion of the memory film 50 overlying the annular dielectric spacer 124 is at least partially etched by the anisotropic etch. Specifically, the portions of the cover material layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the cover material layer 601, the tunneling dielectric layer 56, the charge storage layer 54, and the blocking dielectric layer 52 at a bottom of each memory cavity 49' can be removed to form openings in remaining portions thereof. A semiconductor surface, such as a horizontal surface of an underlying epitaxial channel portion 11, is physically exposed at a bottom of the memory cavity 49' within the memory opening 49.

In addition, tapered portions of the cover material layer 601 and the memory film 50 are removed by the anisotropic etch process. The removed tapered portions of the cover material layer 601 and the memory film 50 can be located above, or in an upper portion of, the neck portion of the cover material layer 601 and the memory film 50 located surrounded by (i.e., at the same level as) the annular dielectric spacer 124. The tapered portion of the memory film 50 adjacent to the tapered sidewall of the annular dielectric spacer 124 located at the level of the joint-level dielectric material layer 172 may be partially or fully etched during the anisotropic etch process. The degree of etching of the memory film at the level of the joint-level dielectric material layer 172 can depend on the alignment of the second-tier openings 249 to the first-tier openings 149 during formation of the second-tier openings 249. In one embodiment, the portion of the memory film 50 located at the level of the joint-level dielectric material layer 172 may be only partially etched by the anisotropic etch process, and the surface of the annular dielectric spacer 124 may not be physically exposed to the memory cavity 49' (as illustrated in FIG. 9E). In another embodiment, the portion of the memory film 50 located at the level of the joint-level dielectric material layer 172 may be etched through at least at one point by the anisotropic etch process, and the surface of the annular dielectric spacer 124 may be physically exposed to the memory cavity 49' (as illustrated in FIG. 10E). The memory film 50 can be continuous or discontinuous (i.e., comprising two vertically separated parts) in the memory opening. In one embodiment, a portion of the annular dielectric spacer 124 can be etched during the anisotropic etch. In this case, the etch resistance of the annular dielectric spacer 124 to the chemistry of the anisotropic etch process may be sufficiently high to prevent the etched surface on the annular dielectric spacer 124 from reaching the bottom surface of the annular dielectric spacer 124. Thus, at least a bottom portion of the annular dielectric spacer 124 is provided between any etched inner sidewall of the annular dielectric spacer 124 and the topmost first sacrificial material layer 142 that underlies the joint-level dielectric material layer 172.

Referring to FIGS. 9F and 10F, the cover material layer 601 can be removed selective to the memory film if the cover material layer 601 includes a sacrificial material. If the cover material layer 601 includes a permanent material that is subsequently employed as a portion of vertical semiconductor channel, the cover material layer 601 can remain intact. In this case, the cover material layer 601 is referred to as an outer semiconductor channel.

A semiconductor channel layer 602 can be deposited directly on the semiconductor surface of the epitaxial channel portion 11 (or the semiconductor substrate layer 10 if the epitaxial channel portion 11 is omitted), and directly on the cover material layer 601. The semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 602 includes amorphous silicon or polysilicon. The semiconductor channel layer 602 can be formed by a conformal deposition method such as low pressure chemical vapor deposition (LPCVD). The thickness of the semiconductor channel layer 602 can be in a range from 2 nm to 10 nm, although lesser and greater thicknesses can also be employed. The semiconductor channel layer 602 may partially fill the memory cavity 49' in each memory opening, or may fully fill the cavity in each memory opening.

The memory film 50 is at least partially etched within a region overlying the tapered inner sidewalls of the annular dielectric spacer 124 at the processing steps of FIGS. 9E and 10E. Thus, the semiconductor material of the semiconductor channel layer 602 can be deposited directly on a portion of the charge storage layer 54 in a region overlying the annular dielectric spacer 124 and at a level of the joint-level dielectric layer 172. Further, depending on the degree of etch into the memory film 50, the semiconductor material of the semiconductor channel layer 602 can be deposited directly on a portion of the blocking dielectric layer 52 in a region overlying the annular dielectric spacer 124 and at a level of the joint-level dielectric layer 172. In some cases, depending on the degree of misalignment between the second-tier memory opening 249 and the first-tier memory opening 149, the degree of etch into the memory film 50, the semiconductor material of the semiconductor channel layer 602 can be deposited directly on at least one surface of the annular dielectric spacer 124, such as a tapered surface and/or a vertical surface of the annular dielectric spacer 124 and at a level of the joint-level dielectric layer 172.

In case the cover material layer 601 is a sacrificial material, and is removed prior to formation of the semiconductor channel layer, the material of the semiconductor channel layer 602 is referred to as a semiconductor channel material. If the cover material layer 601 is an outer semiconductor channel, portions of the semiconductor channel layer 602 inside the memory openings 49 are referred to as an inner semiconductor channel, and the materials of the outer semiconductor channel and the inner semiconductor channel are collectively referred to as a semiconductor channel material. In this case, the semiconductor channel material is a set of all semiconductor material in the cover material layer 601 and the semiconductor channel layer 602.

A dielectric core layer 62L can be deposited in the memory cavity 49'. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating. In case the dielectric core layer 62L is deposited by a conformal deposition process, an encapsulated cavity 47 can be formed within the first-tier memory opening portion of each memory opening 49. As used herein, an "encapsulated cavity" refers to a cavity of which the outer boundary is defined by a single closed surface without any hole therein. Alternatively, the encapsulated cavity 47 can be omitted and the dielectric core layer 62L can fill the entire remaining space within the first-tier memory opening portion of each memory opening 49.

Referring to FIGS. 9G and 10G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the semiconductor channel layer 602 located above the top surface of the insulating cap layer 70 can be removed by a planarization process, which can employ a recess etch or chemical mechanical planarization (CMP). Each remaining portion of the semiconductor channel layer 602 can be located entirety within a memory opening 49 or entirely within a support opening.

In case the cover material layer 601 is an outer vertical semiconductor channel, each adjoining pair of a cover material layer 601 and a semiconductor channel layer 602 can collectively form a vertical semiconductor channel 60 through which electrical current can flow when a vertical NAND device including the vertical semiconductor channel 60 is turned on. In case the cover material layer 601 is a sacrificial material layer and is not present at this step, the vertical semiconductor channel 60 can consist of the semiconductor channel layer 602.

A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIGS. 9H and 10H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63 in the memory openings 49 and to form dummy drain regions 163 in the support openings 19. The dummy drain regions are structurally the same as the drain regions 63, but are not electrically connected to a bit line.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of an epitaxial channel portion 11 (if present), a memory stack structure 55, an optional encapsulated cavity 47 if such a cavity is formed, a dielectric core 62, and a drain region 63 within a memory opening 49 is herein referred to as a memory opening fill structure 53. Each combination of an epitaxial channel portion 11 (if present), a memory film 50, a vertical semiconductor channel 60, an optional encapsulated cavity 47 if such a cavity is formed, a dielectric core 62, and a dummy drain region 163 within each support opening 19 fills the respective support openings 19, and constitutes a support pillar structure 20, as shown in FIGS. 11A and 11B.

As discussed above, depending on the degree of misalignment between the second-tier memory opening 249 and the first-tier memory opening 149, and the degree of etch into the memory film 50, the semiconductor material of the semiconductor channel layer 602 can be deposited directly on at least one surface of the annular dielectric spacer 124, such as a tapered surface and/or a vertical surface of the annular dielectric spacer 124 and at a level of the joint-level dielectric layer 172. As illustrated in FIGS. 10H and 10I, the vertical semiconductor channel 60 including the semiconductor channel layer 602 physically contacts a surface of the annular dielectric spacer 124 within a first azimuthal angle range AAR1 around a vertical axis VA that passes through a geometrical center GC of the memory opening. The geometrical center GC of the memory opening is the center of gravity of a hypothetical object of a homogenous density that occupies the entire volume of the memory opening (which includes the entire volumes defined by a contiguous set of an annular dielectric liner 121 (if present), an annular dielectric spacer 124, an epitaxial channel portion 11, a memory stack structure 55, a dielectric core 62, an encapsulated cavity 47, and a drain region 63). The vertical semiconductor channel 60 does not physically contact the annular dielectric spacer 124 within a second azimuthal angle range AAR2 around the vertical axis VA.

Each dielectric core 62 comprises a dielectric material located inside the vertical semiconductor channel 60. A lower portion of the dielectric core 62 can be located within the first alternating stack (132, 142), and can optionally encapsulate a cavity (i.e., the encapsulated cavity 47) containing vacuum or a gas phase material therein, i.e., free of any solid or liquid material therein. An upper portion of the dielectric core 62 can be located within the second alternating stack (232, 242), and can contact an inner sidewall of the vertical semiconductor channel 60, and can be free of any cavity.

FIGS. 11A and 11B illustrate the exemplary structure after formation of the memory opening fill structures 53 in the memory openings 49 and the support pillar structures 20 in the support openings 19. Each layer (such as the blocking dielectric layer 52, the charge storage layer 54, the tunneling dielectric layer 56, the cover material layer 601 (if present), and the semiconductor channel layer 602) within the support pillar structures 20 can have the same thickness and the same composition as the corresponding layer in the memory opening fill structures 53.

Referring to FIGS. 12A and 12B, a contact level dielectric layer 80 can be formed over the second tier structure (232, 242, 265, 70). The contact level dielectric layer 80 includes a dielectric material such as silicon oxide, a dielectric metal oxide, and/or organosilicate glass. In one embodiment, the contact level dielectric layer 80 can be composed primarily of a silicon oxide material. The thickness of the contact level dielectric layer 80 can be in a range from 50 nm to 500 nm, although lesser and greater thicknesses can also be employed.

A photoresist layer (not shown) can be applied over the contact level dielectric layer 80, and is lithographically patterned to form at least one elongated opening in each area in which formation of a backside contact via structure is desired. The pattern in the photoresist layer can be transferred through the contact level dielectric layer 80, the second tier structure (232, 242, 265, 70), and the first tier structure (132, 142, 172, 165) employing an anisotropic etch to form the at least one backside trench 79, which extends at least to the top surface of the substrate (9, 10). In one embodiment, the at least one backside trench 79 can include a source contact opening in which a source contact via structure can be subsequently formed.

Referring to FIGS. 13A and 13B, an etchant that selectively etches the second material of the sacrificial material layers (142, 242) with respect to the materials of the insulating layers (132, 232) and the semiconductor material(s) of the substrate (9, 10) can be introduced into the at least one backside trench 79, for example, employing an etch process. Backside recesses (143, 243) are formed in volumes from which the sacrificial material layers (142, 242) are removed. Specifically, first backside recesses 143 are formed in the volumes from which the first sacrificial material layers 142 are removed, and second backside recesses 243 are formed in the volumes from which the second sacrificial material layers 242 are removed.

The removal of the second material of the sacrificial material layers (142, 242) can be selective to the materials of the insulating layers (132, 232), the materials of the retro-stepped dielectric material portions (165, 265), the semiconductor material(s) of the substrate (9, 10), and the material of the outermost layer of the memory films 50. Each backside recess (143, 243) can be a laterally extending cavity having a lateral dimension that is greater than the vertical extent of the cavity. In other words, the lateral dimension of each backside recess (143, 243) can be greater than the height of the backside recess (143, 243). The joint-level memory openings 49, the first-tier support openings 119, and the second-tier support openings 219 are herein referred to as front side openings or front side cavities in contrast with the backside recesses (143, 243). In one embodiment, the memory array region 100 comprises an array of monolithic three-dimensional NAND strings having a plurality of device levels disposed above the substrate (9, 10). In this case, each backside recess (143, 243) can define a space for receiving a respective word line of the array of monolithic three-dimensional NAND strings.

Each of the plurality of backside recesses (143, 243) can extend substantially parallel to the top surface of the substrate (9, 10). A backside recess (143, 243) can be vertically bounded by a top surface of an underlying insulating layer (132, 232) and a bottom surface of an overlying insulating layer (132, 232). In one embodiment, each backside recess (143, 243) can have a uniform height throughout.

Subsequently, physically exposed surface portions of the optional epitaxial channel portions 11 and the semiconductor material layer 10 may be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616.

Referring to FIGS. 14A and 14B, a backside blocking dielectric layer (not shown) can be optionally formed. The backside blocking dielectric layer, if present, comprises a dielectric material that functions as a control gate dielectric for the control gates to be subsequently formed in the backside recesses (143, 243). In case the blocking dielectric layer 52 is present within each memory opening, the backside blocking dielectric layer is optional. In case the blocking dielectric layer 52 is omitted, the backside blocking dielectric layer is present The backside blocking dielectric layer can be formed in the backside recesses (143, 243) and on a sidewall of the backside trench 79. The backside blocking dielectric layer can be formed directly on horizontal surfaces of the insulating layers (132, 232) and physically exposed sidewalls of the blocking dielectric 52 within the backside recesses (143, 243). If the backside blocking dielectric layer is formed, formation of the tubular dielectric spacers and the planar dielectric portion prior to formation of the backside blocking dielectric layer is optional. In one embodiment, the backside blocking dielectric layer can be formed by a conformal deposition process such as atomic layer deposition (ALD). The backside blocking dielectric layer can consist essentially of aluminum oxide. The thickness of the backside blocking dielectric layer can be in a range from 1 nm to 15 nm, such as 2 to 6 nm, although lesser and greater thicknesses can also be employed.

The dielectric material of the backside blocking dielectric layer can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. A backside cavity is present within the portion of each backside trench 79 that is not filled with the backside blocking dielectric layer.

At least one conducive material can be deposited to form electrically conductive layers (146, 246). The at least one conductive material can include a metallic liner and a conductive fill material layer. The metallic liner can include a metallic nitride material such as TiN, TaN, WN, an alloy thereof, or a stack thereof. The metallic liner functions as a diffusion barrier layer and an adhesion promotion layer. The metallic liner can be deposited by a conformal deposition method such as chemical vapor deposition (CVD) or atomic layer deposition (ALD), and can have a thickness in a range from 1 nm to 6 nm, although lesser and greater thicknesses can also be employed. The conductive fill material layer can be deposited directly on the metallic liner by a conformal deposition method such as chemical vapor deposition or atomic layer deposition. The conductive fill material layer includes a conductive material. The conductive material can include at least one elemental metal such as W, Cu, Co, Mo, Ru, Au, and Ag. Additionally or alternatively, the conductive fill material layer (146, 246) can include at least one intermetallic metal alloy material. Each intermetallic metal alloy material can include at least two metal elements selected from W, Cu, Co, Mo, Ru, Au, Ag, Pt, Ni, Ti, and Ta. In one embodiment, the conductive fill material layer can consist essentially of W, Co, Mo, or Ru.

Each portion of the at least one conducive material that fills a backside recess (142 or 243) constitutes an electrically conductive layer (146 or 246). The electrically conductive layers (146, 246) include first electrically conductive layers 146 that are formed in the first backside recesses 143 in the first tier structure, and second electrically conductive layers 246 that are formed in the second backside recesses 243 in the second tier structure. The portion of the at least one conductive material that excludes the electrically conductive layers (146, 246) constitutes continuous metallic material layer 46L. A plurality of electrically conductive layers (146, 246) can be formed in the plurality of backside recesses (143, 243), and the continuous metallic material layer 46L can be formed on the sidewalls of each backside trench 79 and over the contact level dielectric layer 80. A backside cavity is present in the portion of each backside trench 79 that is not filled with the backside blocking dielectric layer and the continuous metallic material layer 46L.

While the backside recesses (143, 243) remain as cavities, i.e., between removal of the sacrificial material layers (142, 242) and formation of the electrically conductive layers (146, 246) in the backside recesses (143, 243), the memory opening fill structures 53 and the support pillar structures 20 mechanically support the first and second insulating layers (132, 142), the insulating cap layer 70, and the contact level dielectric layer 80. Thus, each first sacrificial material layer 142 can be replaced with a respective first electrically conductive layer 146, and each second sacrificial material layer 242 can be replaced with a respective second electrically conductive layer 246, while the memory opening fill structures 53 and the support pillar structures 20 provide structural support to the first and second insulating layers (132, 232).

Referring to FIGS. 15A and 15B, the deposited metallic material of the continuous electrically conductive material layer 46L is etched back from the sidewalls of each backside trench 79 and from above the contact level dielectric layer 80, for example, by an isotropic wet etch, an anisotropic dry etch, or a combination thereof. The electrically conductive layers (146, 246) in the backside recesses are not removed by the etch process. In one embodiment, the sidewalls of each electrically conductive layer (146 or 246) can be vertically coincident after removal of the continuous electrically conductive material layer 46L.

Each electrically conductive layer (146 or 246) can function as a combination of a plurality of control gate electrodes located at a same level and a word line electrically interconnecting, i.e., electrically shorting, the plurality of control gate electrodes located at the same level. The plurality of control gate electrodes within each electrically conductive layer (146 or 246) are the control gate electrodes for the vertical memory devices including the memory stack structures 55. In other words, each electrically conductive layer (146 or 246) can be a word line that functions as a common control gate electrode for the plurality of vertical memory devices.

Referring to FIGS. 16A and 16B, an insulating material layer can be formed in the at least one backside trench 79 and over the contact level dielectric layer 80 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed. An anisotropic etch is performed to remove horizontal portions of the insulating material layer from above the contact level dielectric layer 80 and at the bottom of each backside trench 79. Each remaining portion of the insulating material layer constitutes an insulating spacer 74. The anisotropic etch can continue to etch through physically exposed portions of the planar dielectric portion, if present, in each backside trench 79. Thus, an insulating spacer 74 is formed in each backside trench 79 directly on physically exposed sidewalls of the electrically conductive layers (146, 246).

A source region 61 can be formed underneath each backside trench 79 by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can contact a bottom surface of the insulating spacer 74. A surface portion of the semiconductor material layer 10 adjoining a source region 61 and continuously extending to the epitaxial channel portions 11 constitutes a horizontal semiconductor channel 59, which is a common portion of a plurality of semiconductor channels (59, 11, 60) that include the vertical semiconductor channels 60 within the memory stack structures 55.

A backside contact via structure 76 can be formed within each cavity. Each contact via structure 76 can fill a respective cavity. The backside contact via structures 76 can be formed by depositing at least one conductive material in the remaining unfilled volume (i.e., the backside cavity) of the backside trench 79. For example, the at least one conductive material can include a conductive liner (not expressly shown) and a conductive fill material portion (not expressly shown). The conductive liner can include a metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact level dielectric layer 80 overlying the alternating stacks (132, 146, 232, 246) as a stopping layer. If chemical mechanical planarization (CMP) process is employed, the contact level dielectric layer 80 can be employed as a CMP stopping layer. Each remaining continuous portion of the at least one conductive material in the backside trenches 79 constitutes a backside contact via structure 76. Each backside contact via structure 76 can be formed directly on a top surface of a source region 61. Each backside contact via structure 76 can contact a respective source region 61, and can be laterally surrounded by a respective insulating spacer 74.

Referring to FIGS. 17A and 17B, additional contact via structures (88, 86) can be formed through the contact level dielectric layer 80 and through the retro-stepped dielectric material portions (165, 265). For example, drain contact via structures 88 can be formed through the contact level dielectric layer 80 on each drain region 63. Each drain contact via structure 88 can be formed through the contact level dielectric layer 80 on each of the drain regions 63, while not forming any conductive structure through the contact level dielectric layer 80 over the doped semiconductor material portions of the dummy drain regions 163.

Control gate contact via structures 86 can be formed in the terrace region on the electrically conductive layers (146, 246) through the contact level dielectric layer 80, and through the retro-stepped dielectric material portions (165, 265). The control gate contact via structures 86 vertically extend at least through a dielectric material portion (i.e., the second retro-stepped dielectric material portion 265) within the second tier structure (232, 246, 265, 70), and contact a respective electrically conductive layer selected from the first and second electrically conductive layers (146, 246). Peripheral gate contact via structures (not shown) and peripheral active region contact via structures (not shown) can be formed through the retro-stepped dielectric material portions (165, 265) directly on respective nodes of the peripheral devices 700 (See FIG. 1).

While the present disclosure is described employing an embodiment in which the first and second spacer material layers are formed as first and second sacrificial material layers (142, 242), respectively, embodiments are expressly contemplated herein in which the first and second spacer material layers are formed as first and second electrically conductive layers (146, 246) at the time of formation of the alternating stacks, i.e., at the processing steps of FIGS. 2A and 2B and at the processing steps of FIGS. 6A and 6B. In this case, processing steps employed to replace the first and second sacrificial material layers (142, 242) with the first and second electrically conductive layers (146, 246), respectively, can be omitted.

The exemplary structure of the present disclosure can include a three-dimensional memory device. The three-dimensional memory device can comprise: a first alternating stack (132, 146) of first insulating layers 132 and first electrically conductive layers 146 and located over a substrate (9, 10); a joint-level dielectric material layer 172 overlying the first alternating stack (132, 146); a second alternating stack (232, 246) of second insulating layers 232 and second electrically conductive layers 246 and overlying the joint-level dielectric material layer 172; a memory stack structure 55 comprising a memory film 50 and a vertical semiconductor channel 60 extending through the first alternating stack (132, 146), the joint-level dielectric material layer 172, and the second alternating stack (232, 246); and an annular dielectric spacer 124 laterally surrounding the memory stack structure 55 and surrounded by the joint-level dielectric material layer 172, wherein at least a part of, such as the entirety of a bottom surface of the annular dielectric spacer 124 is in physical contact with a surface of an outermost dielectric material layer of the memory film 50 (such as the blocking dielectric layer 52) of the memory stack structure 55.

In one embodiment, the bottom surface of the annular dielectric spacer 124 is a planar annular bottom surface of the annular dielectric spacer 124 located above a first horizontal plane including an interface between the first alternating stack (132, 146) and the joint-level dielectric material layer 172. As used herein, a "planar" surface refers to a surface located entirely within a two-dimensional Euclidean plane. In one embodiment, a tapered inner sidewall of the annular dielectric spacer 124 contacts a tapered outer sidewall of the memory stack structure 55 below a second horizontal plane including an interface between the joint-level dielectric material layer 172 and the second alternating stack (232, 246).

In one embodiment, the inner periphery of the bottom surface of the annular dielectric spacer 124 can be laterally offset from the outer periphery of the bottom surface of the annular dielectric spacer 124 by a uniform lateral offset distance, which is the lateral thickness of the annular dielectric spacer 124.

In one embodiment, the memory stack structure 55 can comprise: a vertical outer sidewall that laterally protrudes farther outward than an outer sidewall of the annular dielectric spacer 124, contacts a sidewall of the joint-level dielectric material layer 172, and adjoined to a bottom surface of the bottommost layer of the second alternating stack (232, 246); and a horizontal surface that contacts a portion of the bottommost layer within the second alternating stack (232, 246) and adjoined to an upper periphery of the vertical outer sidewall.

In one embodiment, the three-dimensional memory device can further comprise an annular dielectric liner 121 contacting an outer sidewall of the annular dielectric spacer 124 and contacting a sidewall of an opening through the joint-level dielectric material layer 172 (which is a portion of the memory opening 49), wherein a bottom periphery of an outer sidewall of the annular dielectric liner 121 coincides with a top periphery of an outer sidewall of a portion of the memory stack structure 55 that contacts the first alternating stack (132, 146) and a lower portion of the joint-level dielectric material layer 172. Alternatively, the annular dielectric liner 121 may be omitted. In this case, a bottom periphery of an outer sidewall of the annular dielectric spacer 124 can coincide with a top periphery of an outer sidewall of a portion of the memory stack structure 55 that contacts the first alternating stack (132, 146) and a lower portion of the joint-level dielectric material layer 172.

In one embodiment, the surface of the outermost dielectric material layer of the memory film 50 (such as the blocking dielectric layer 52) of the memory stack structure 55 that physically contacts the bottom surface of the annular dielectric spacer 124 can be an annular horizontal surface of the memory stack structure 55. An inner periphery of the annular horizontal surface of the memory stack structure 55 can adjoin a vertical sidewall of a neck portion of the memory stack structure 55 surrounded by the joint-level dielectric material layer 172. An outer periphery of the annular horizontal surface of the memory stack structure 55 adjoins a vertical sidewall of a bottom portion of the memory stack structure 55 located within the first alternating stack (132, 146) and a lower portion of the joint-level dielectric material layer 172.

In one embodiment, a terrace region can be provided, in which each electrically conductive layer (146, 246) other than a topmost electrically conductive layer within the first and second alternating stacks (132, 146, 232, 246) laterally extends farther than any overlying electrically conductive layer within the first and second alternating stacks (132, 146, 232, 246). The terrace region includes stepped surfaces of the first and second alternating stacks (132, 146, 232, 246) that continuously extend from a bottommost layer within the first and second alternating stacks (132, 146, 232, 246) to a topmost layer within the first and second alternating stacks (132, 146, 232, 246). Each support pillar structure 20 can extend through the stepped surfaces and through a respective retro-stepped dielectric material portion (165 or 265) that overlies the stepped surfaces. Each of the word line contact via structures 86 can contact a respective electrically conductive layer among the first and second electrically conductive layers (146, 246) in the terrace region.

The exemplary structures can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a memory material layer 54 at a level of an electrically conductive layer 46) in a first device level of the array of monolithic three-dimensional NAND strings can be located over another memory cell (as embodied as another portion of the memory material layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as portions of the memory material layer located at levels of the electrically conductive layers 46). Each charge storage element can be located adjacent to a respective one of the plurality of semiconductor channels (59, 11, 60). As used herein, a direction is substantially perpendicular to a plane if the angle between the direction and the plane is within the range from 87 degrees to 93 degrees.

The exemplary structure of the present disclosure provides the annular dielectric spacer 124, which functions as an etch stop structure during the anisotropic etch of the memory film 50 to form an opening therethrough at the bottom of each memory opening 49. The annular dielectric spacer 124 prevents or reduces etch damage to portions of the memory film 50 that contacts the first electrically conductive layers 146 by reducing or preventing ions of the plasma from impinging on sidewall portions of the memory film that underlie the annular dielectric spacer. Further, even if a tapered portion of the memory film is etched through above the annular dielectric spacer, the annular dielectric spacer can prevent an electrical short between a vertical semiconductor channel 60 and electrically conductive layers 146 formed at levels of the spacer material layers. Any damage to the memory film 50 and/or openings through the memory film 50 during the anisotropic etch is vertically spaced from the first electrically conductive layers 146 at least by a lower portion of the annular dielectric spacer 124. Thus, damage or opening through the memory films 50 that is generated during the anisotropic etch occurs adjacent the dielectric spacer 124 and the joint-level dielectric material layer 172 which are both electrically insulating. Thus, the damage or opening through the memory films 50 does not result in an electrical short between the vertical semiconductor channel 60 and the first electrically conductive layers 146 upon formation of the first electrically conductive layers 146.

According to aspects of the present disclosure, structures and methods are disclosed herein, which can be employed to completely separate the peripheral devices from NAND cells with silicon nitride encapsulating material portions. The silicon nitride encapsulating material portions are provided at the interface between NAND cells and the peripheral device region. The peripheral transistor of the NAND memory device is covered by silicon nitride film for blocking hydrogen, while the cell area (e.g., the device region, such as the memory array region) 100 is not covered by silicon nitride film.

Figure 18:
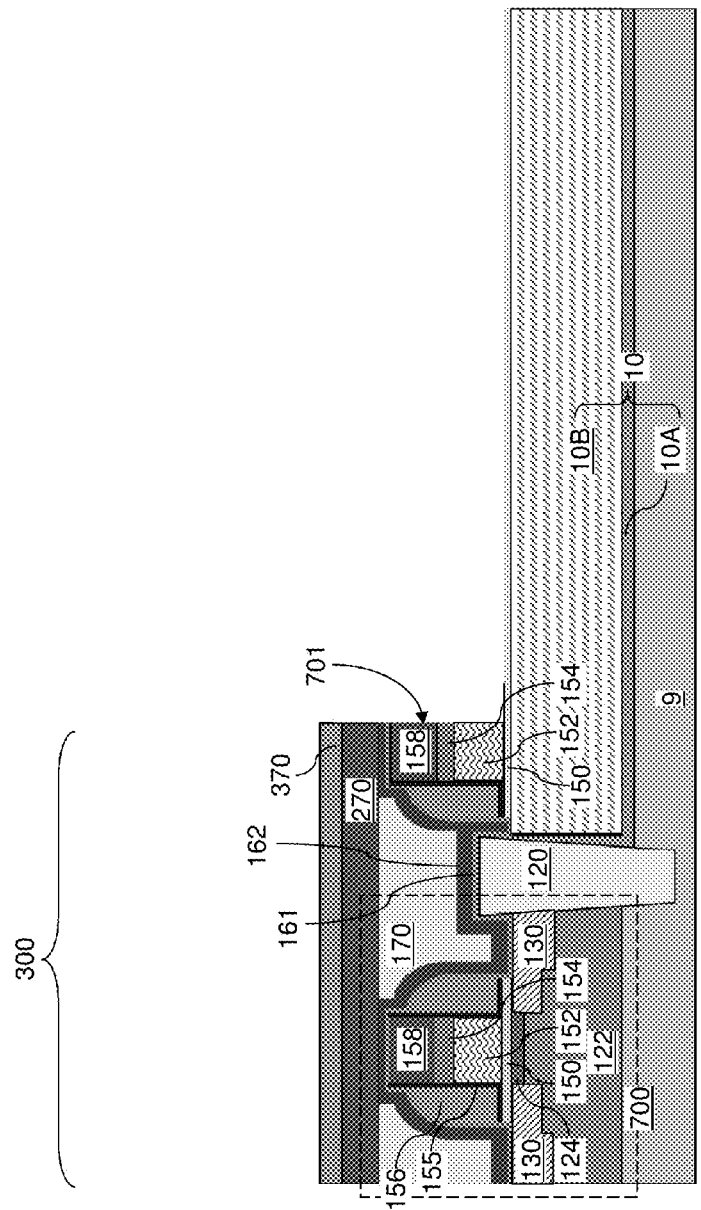
FIG. 18 is a vertical cross-sectional view of a first exemplary structure after defining a sidewall of a peripheral device region.

Referring to FIG. 18, a first exemplary structure is shown after defining a sidewall 701 of a peripheral device region 300. The sidewall 701 is formed at a cell-peripheral border region to define a barrier to block pathway of hydrogen gas by silicon nitride film. The at least one semiconductor device 700 can include a field effect transistor including a body region 122 and a channel region 124, and optionally including an L-shaped dielectric spacer 155 (which can include silicon oxide) in addition to components described above. Further, at least one dielectric cap layer (270, 370) can be provided, which can include a first dielectric cap layer 270 and a second dielectric cap layer 370. The at least one dielectric cap layer (270, 370) can be employed as a planarization stopping layer during a subsequent chemical mechanical planarization process and/or as an etch stop layer during a subsequent anisotropic etch process. Each of the at least one dielectric cap layer (270, 370) can include a dielectric material such as silicon nitride and a dielectric metal oxide material (such as aluminum oxide). The semiconductor material layer 10 can include, for example, a first conductivity type doped well 10A and a second conductivity type doped well 10B. For example, the substrate semiconductor layer 9 can include p-doped silicon, the first conductivity type doped well 10A can include n-doped silicon, and the second conductivity type doped well 10B can be include p-doped silicon.

Figure 19:
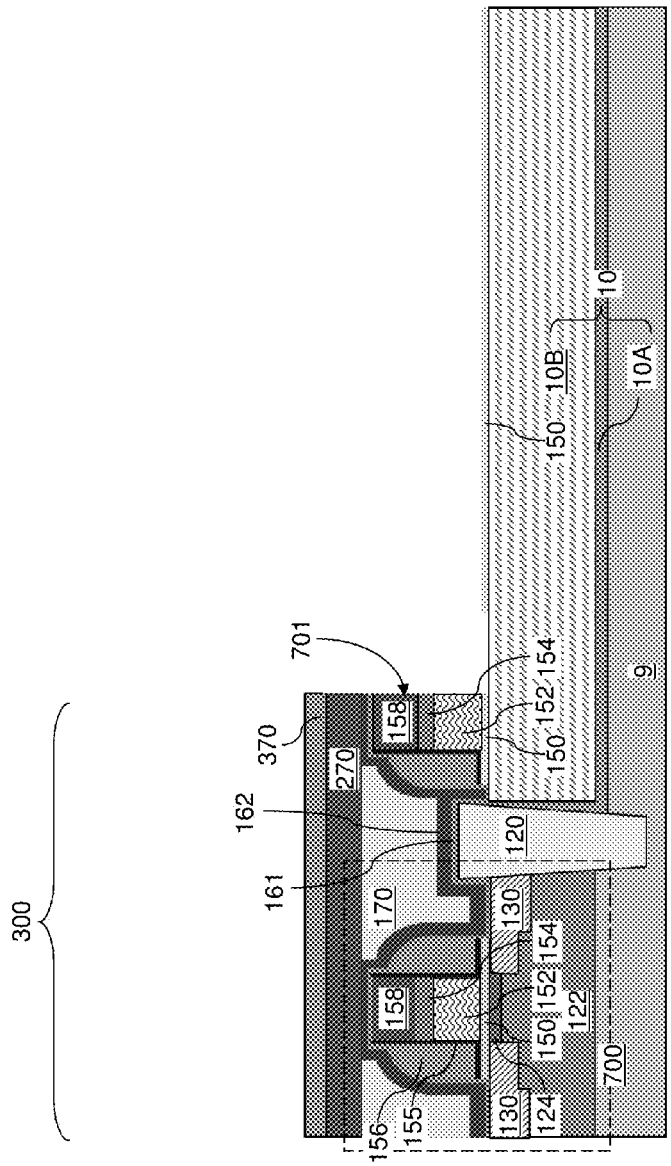
FIG. 19 is a vertical cross-sectional view of the first exemplary structure after removing physically exposed portions of a gate dielectric layer.

Referring to FIG. 19, after the sidewall 701 of the peripheral device region is formed on the substrate (9, 10) (which may be a silicon substrate), a portion of a gate dielectric layer 150 (which includes a silicon oxide layer) is removed from a portion of the substrate in proximity to the sidewall.

Figure 20:
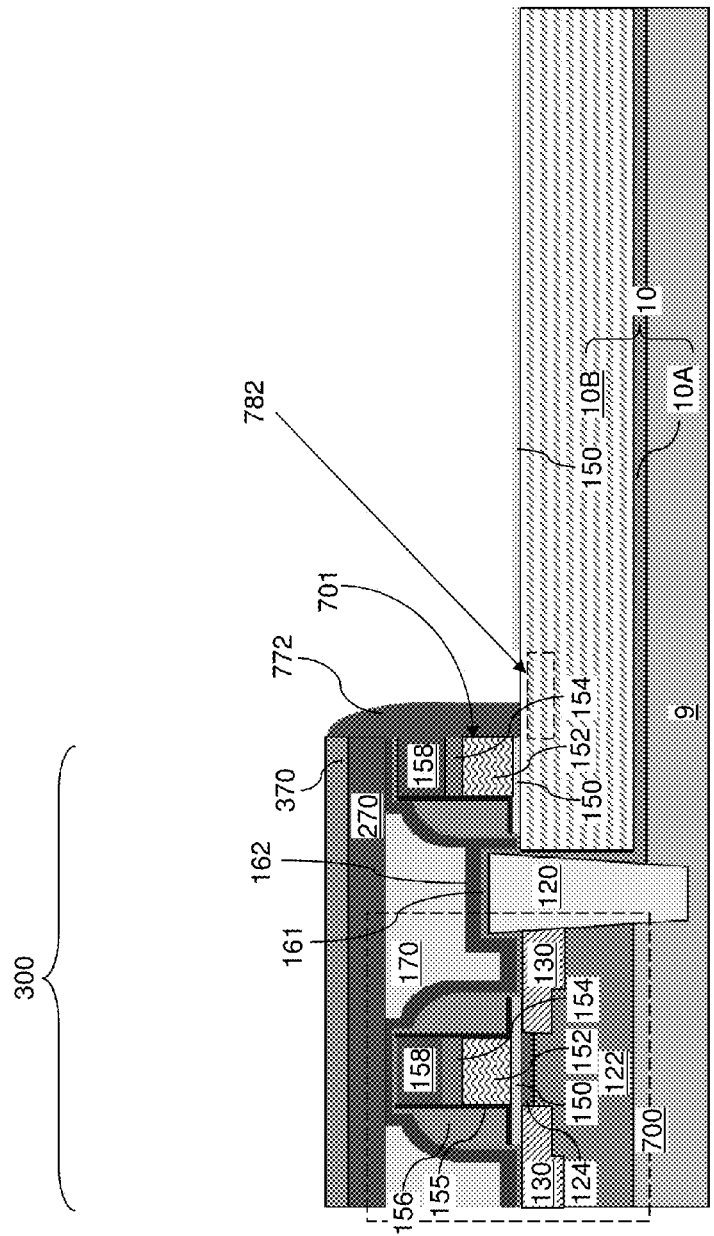
FIG. 20 is a vertical cross-sectional view of the first exemplary structure after forming a silicon nitride spacer.

Referring to FIG. 20, a silicon nitride spacer 772 is formed on the sidewall 701 of the peripheral device region 300. The inventors experimentally verified drastic reduction of barrier break failure through use of the silicon nitride spacer 772 of FIG. 20 relative to prior a art structure in which a silicon oxide material is deposited directly on the sidewall 701 of FIG. 18. Thus, the silicon nitride spacer 772 effectively blocks hydrogen diffusion through the silicon oxide layers under, and over, a gate electrode stack (152, 154) at the edge of the peripheral device region 300. In addition to formation of the silicon nitride spacer 772, boron atoms can be implanted adjacent to the sidewall 701 of the peripheral device region 300 to form a boron-implanted region 782, which retards diffusion of hydrogen atoms through the silicon substrate (9, 10).

Figure 21:
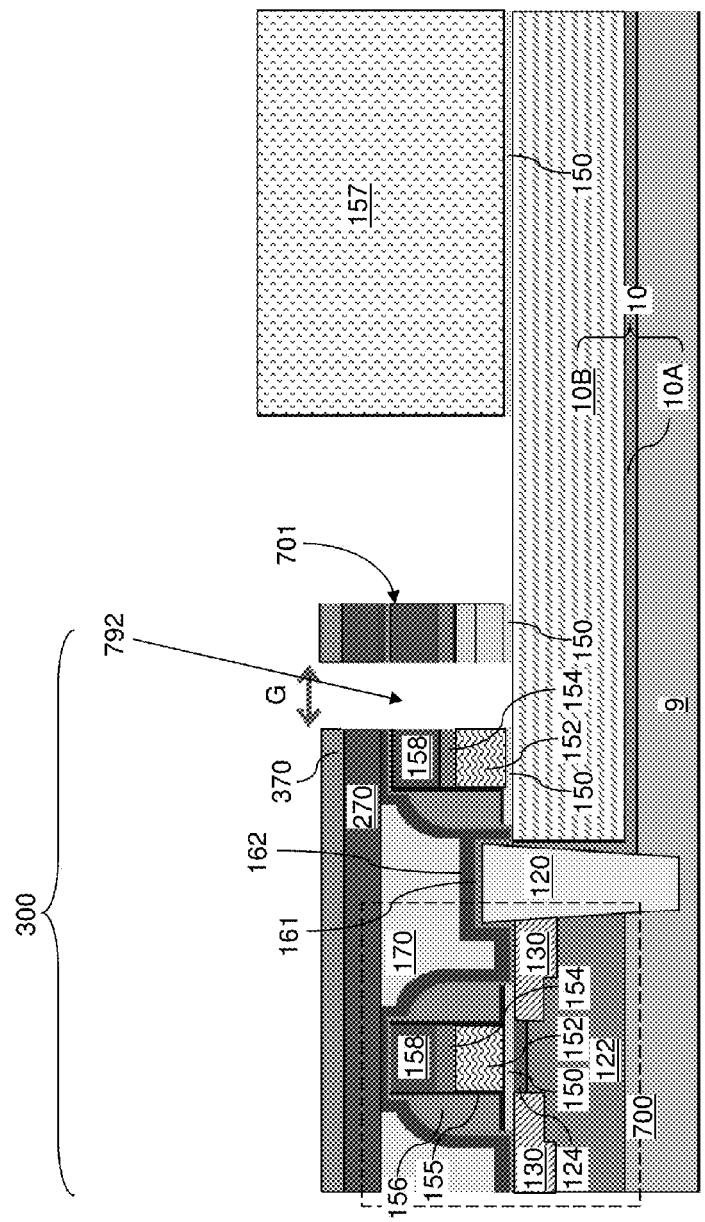
FIG. 21 is a vertical cross-sectional view of a second exemplary structure after patterning a moat trench at an edge of a peripheral device region.

Referring to FIG. 21, a moat trench 792 is formed in addition to a sidewall 701 of the peripheral device region 300 according to an embodiment of the present disclosure. A blocking mask 157 is employed to protect a portion of a gate oxide layer in a device region 100 (which can include a memory array region in a region that is distal from the peripheral device region 300).

Figure 22:
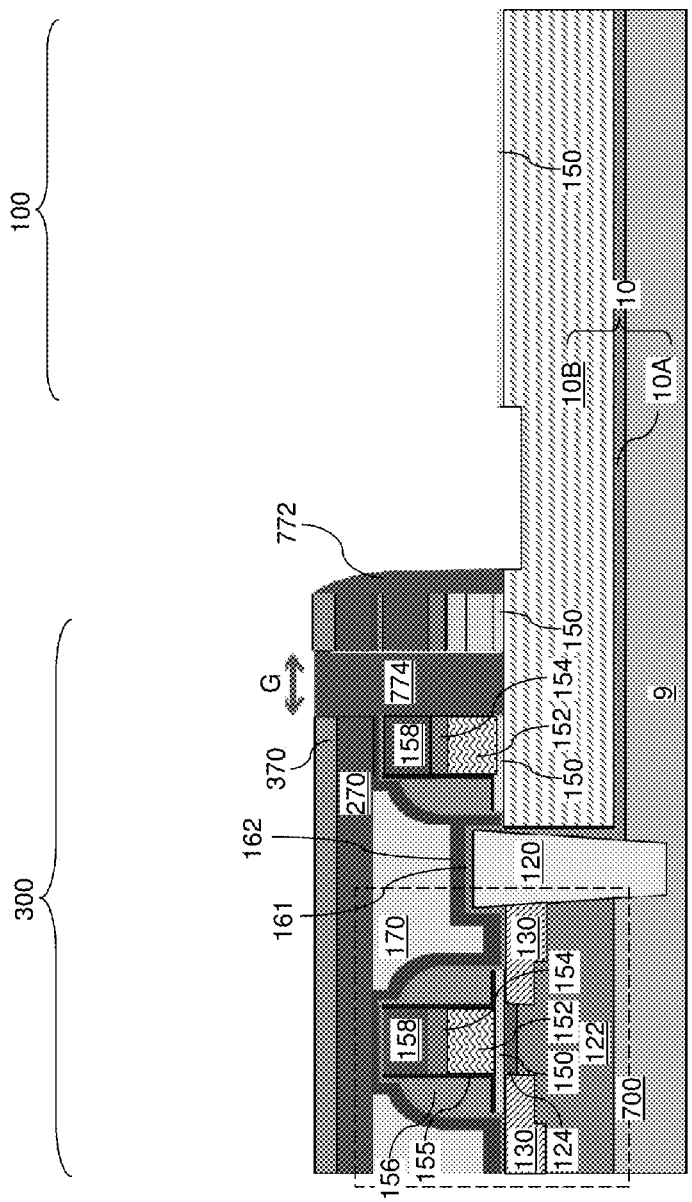
FIG. 22 is a vertical cross-sectional view of the second exemplary structure after formation of a silicon nitride moat fill structure and a silicon nitride spacer.
Figure 23:
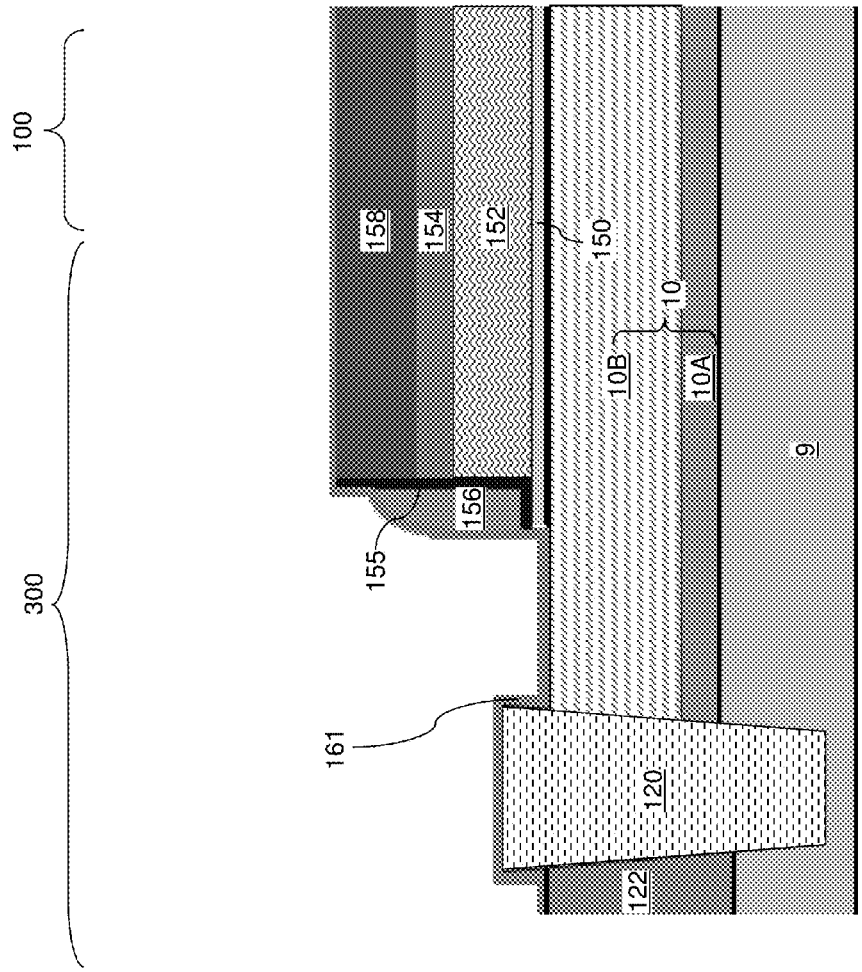
FIG. 23 is a vertical cross-sectional view of a third exemplary structure after formation of a silicon oxide liner.

Referring to FIG. 22, physically exposed portions of the gate oxide layer 150 are removed to expose an underlying semiconductor surface. The blocking mask 157 can be removed. Silicon nitride is deposited and anisotropically etched to form a silicon nitride moat fill structure 774 and a silicon nitride spacer 772.

Referring to FIG. 17, a third exemplary structure is illustrated, which can be formed by patterning gate stack layers (152, 154, 158) so that the gate stack layers (152, 154, 158) remain in the device region 100. Implanted regions (source and drain regions, not shown) can be formed in the peripheral device region 300. Silicon oxide gate spacers 156 can be formed. A silicon oxide liner 161 can be subsequently formed.

Figure 24:
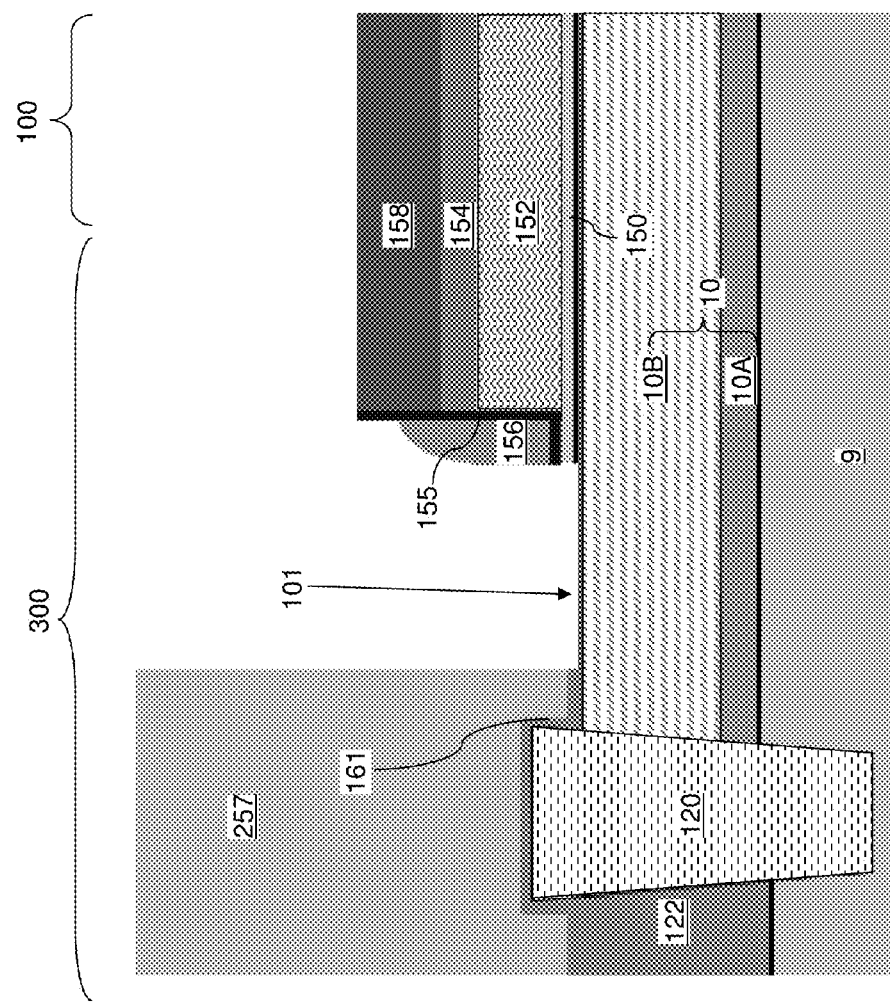
FIG. 24 is a vertical cross-sectional view of the third exemplary structure after removal of a peripheral portion of the silicon oxide liner.

Referring to FIG. 24, the silicon oxide layer 161 can be patterned so that a semiconductor surface 101 is physically exposed inside the edge of the peripheral device region 300. A photoresist layer 257 and an etch process can be employed to pattern the silicon oxide layer 161.

Figure 25:
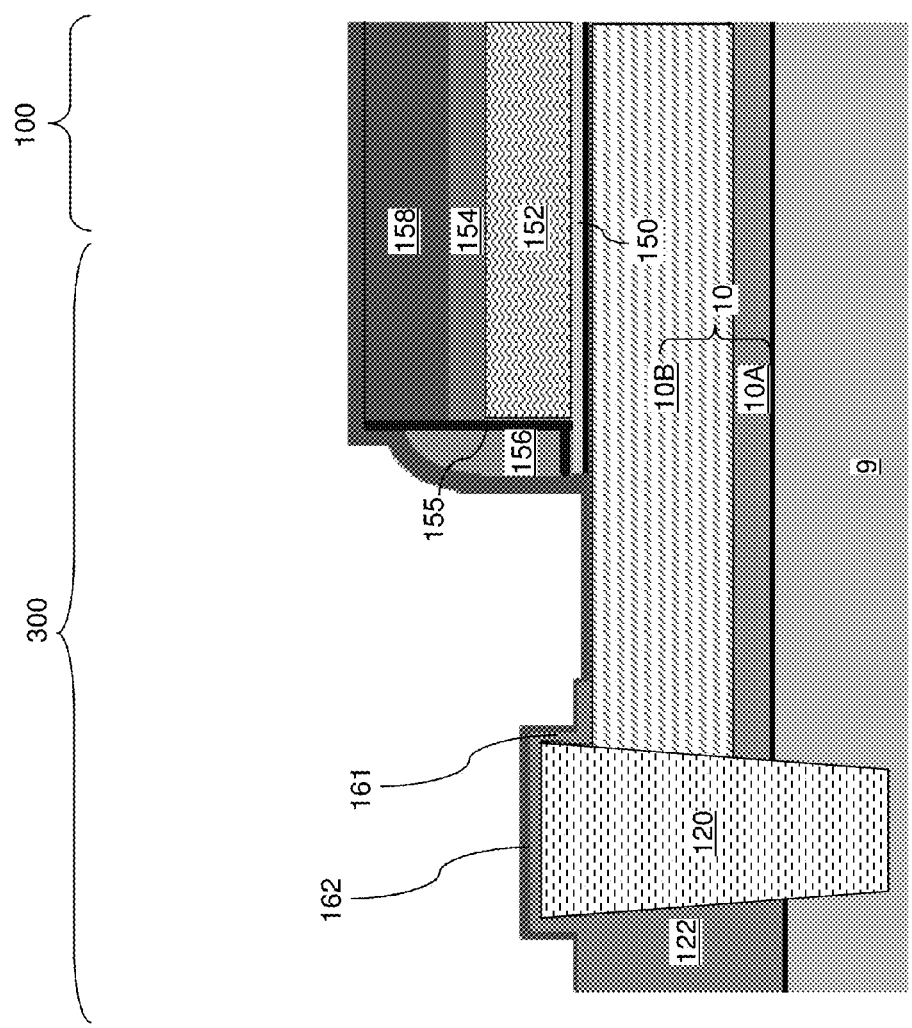
FIG. 25 is a vertical cross-sectional view of the third exemplary structure after formation of a silicon nitride liner.

Referring to FIG. 25, a silicon nitride layer 162 can be deposited directly on the physically exposed semiconductor surface of the substrate (9, 10) and over the silicon oxide layer 161.

Figure 26:
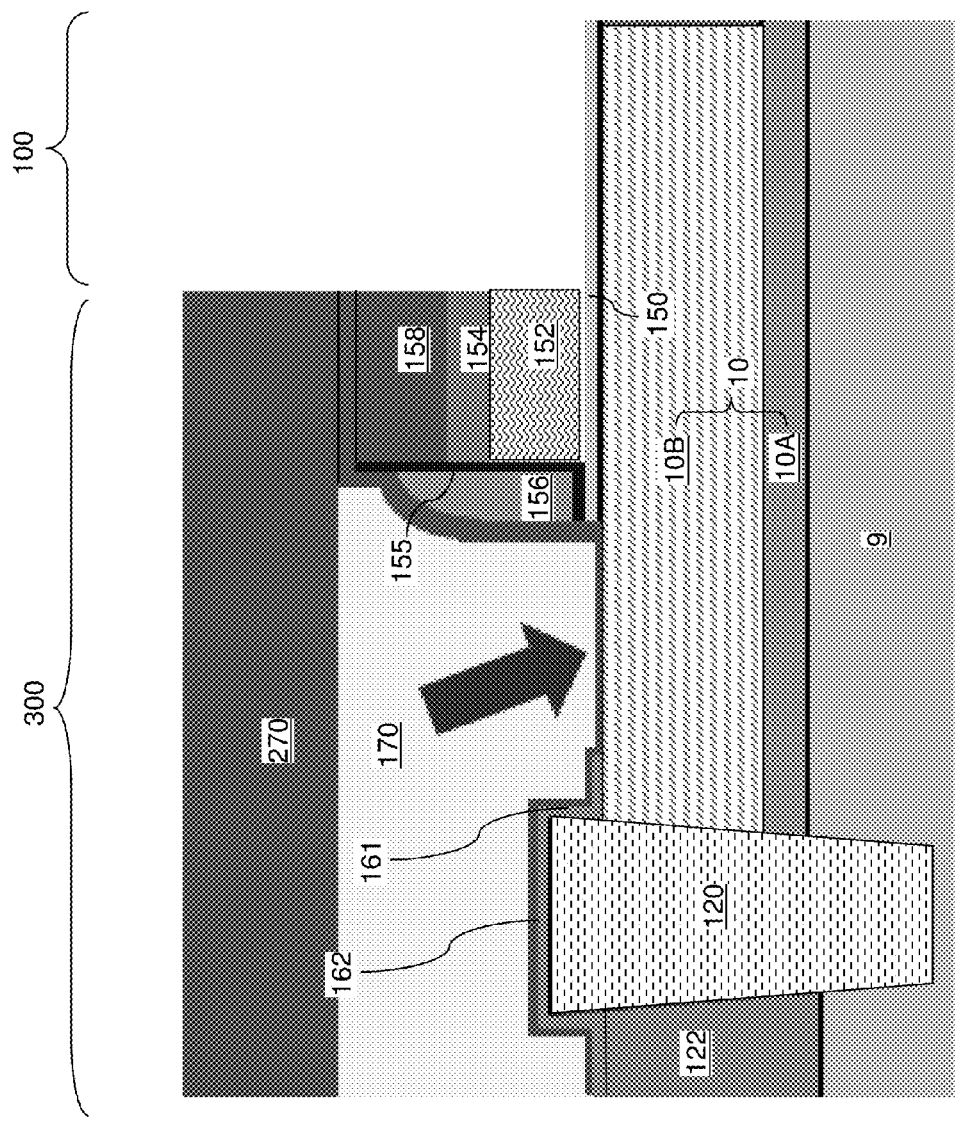
FIG. 26 is a vertical cross-sectional view of the third exemplary structure after formation of a silicon nitride cap layer.

Referring to FIG. 26, an additional silicon oxide layer can be deposited and planarized to form a planarization dielectric layer 170. A silicon nitride cap layer 270 can be deposited over the silicon oxide layer 170. The silicon nitride cap layer 270 and the gate stack layers (152, 142, 158) can be removed from the device region 100. The remaining portion of the silicon nitride cap 270 layer and the silicon nitride liner 162 provides a sealing structure that prevents diffusion of hydrogen into the peripheral devices during a subsequent hydrogen anneal process.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A three-dimensional memory device comprising:
a first alternating stack of first insulating layers and first electrically conductive layers and located over a substrate;
a joint-level dielectric material layer overlying the first alternating stack;
a second alternating stack of second insulating layers and second electrically conductive layers and overlying the joint-level dielectric material layer;
a memory stack structure comprising a memory film and a vertical semiconductor channel, the memory stack structure extending through the first alternating stack, the joint-level dielectric material layer, and the second alternating stack; and
an annular dielectric spacer laterally surrounding the memory stack structure and surrounded by the joint-level dielectric material layer,
wherein:
at least a portion of a bottom surface of the annular dielectric spacer is in physical contact with a surface of an outermost dielectric material layer of the memory film of the memory stack structure;
the vertical semiconductor channel physically contacts a surface of the annular dielectric spacer within a first azimuthal angle range around a vertical axis that passes through a geometrical center of the memory opening; and the vertical semiconductor channel does not physically contact the annular dielectric spacer within a second azimuthal angle range around the vertical axis.

2. The three-dimensional memory device of claim 1, wherein the bottom surface of the annular dielectric spacer is a planar annular bottom surface located above a first horizontal plane including an interface between the first alternating stack and the joint-level dielectric material layer.

3. The three-dimensional memory device of claim 2, wherein:
a tapered inner sidewall of the annular dielectric spacer contacts a tapered outer sidewall of the memory stack structure below a second horizontal plane including an interface between the joint-level dielectric material layer and the second alternating stack; and
the joint-level dielectric material layer is thicker than each of the first and the second insulating layers.

4. The three-dimensional memory device of claim 1, wherein an inner periphery of the bottom surface of the annular dielectric spacer is laterally offset from an outer periphery of the bottom surface of the annular dielectric spacer by a uniform lateral offset distance.

5. The three-dimensional memory device of claim 1, wherein:
the memory film comprises a layer stack including, from outside to inside, a blocking dielectric layer, a charge storage layer, and a tunneling dielectric layer; and
the memory stack structure comprises:
a vertical outer sidewall that laterally protrudes farther outward than an outer sidewall of the annular dielectric spacer; and
a horizontal surface that contacts a portion of a bottommost layer within the second alternating stack and adjoined to an upper periphery of the vertical outer sidewall.

6. The three-dimensional memory device of claim 1, further comprising an annular dielectric liner contacting an outer sidewall of the annular dielectric spacer and contacting a sidewall of an opening through the joint-level dielectric material layer, wherein a bottom periphery of an outer sidewall of the annular dielectric liner coincides with a top periphery of an outer sidewall of a portion of the memory stack structure that contacts the first alternating stack and a lower portion of the joint-level dielectric material layer.

7. The three-dimensional memory device of claim 1, wherein a bottom periphery of an outer sidewall of the annular dielectric spacer coincides with a top periphery of an outer sidewall of a portion of the memory stack structure that contacts the first alternating stack and a lower portion of the joint-level dielectric material layer.

8. The three-dimensional memory device of claim 1, wherein:
the surface of the outermost dielectric material layer of the memory film of the memory stack structure that physically contacts the entirety of the bottom surface of the annular dielectric spacer is an annular horizontal surface of the memory stack structure;
an inner periphery of the annular horizontal surface of the memory stack structure adjoins a vertical sidewall of a neck portion of the memory stack structure surrounded by the joint-level dielectric material layer; and
an outer periphery of the annular horizontal surface of the memory stack structure adjoins a vertical sidewall of a bottom portion of the memory stack structure located within the first alternating stack and a lower portion of the joint-level dielectric material layer.

9. The three-dimensional memory device of claim 1, further comprising a dielectric core comprising a dielectric material located inside the vertical semiconductor channel, wherein:
a lower portion of the dielectric core located within the first alternating stack encapsulates a cavity containing vacuum or a gas phase material therein; and
an upper portion of the dielectric core located within the second alternating stack contacts an inner sidewall of the vertical semiconductor channel and is free of any cavity.

10. The three-dimensional memory device of claim 1, wherein:
the three-dimensional memory device comprises a monolithic three-dimensional NAND memory device;
the first and second electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the first and second electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate; and
a plurality of charge storage elements, each charge storage element located adjacent to a respective one of the plurality of semiconductor channels.

11. The three-dimensional memory device of claim 1, further comprising:
a device region containing an array of vertical NAND strings that includes the memory stack structure;
a peripheral device region; and
a silicon nitride barrier which separates the peripheral device region from the array of vertical NAND strings which is configured to block a pathway of hydrogen gas to the peripheral device region.

12. The three-dimensional memory device of claim 11, wherein the silicon nitride barrier is a silicon nitride spacer that includes a convex sidewall that faces outward from the peripheral device region.

13. The three-dimensional memory device of claim 11, wherein the silicon nitride barrier is a silicon nitride moat trench fill material located between the device region and the peripheral device region.

14. The three-dimensional memory device of claim 11, wherein the silicon nitride barrier is a silicon nitride liner that includes a convex sidewall that faces inward toward the peripheral device region.

15. The three-dimensional memory device of claim 11, wherein the silicon nitride barrier laterally encapsulates the peripheral device region and extends from a top surface of the substrate to an overlying silicon nitride layer.

\* \* \* \* \*